(12) United States Patent
Fulford et al.

(10) Patent No.: US 12,457,768 B2
(45) Date of Patent: *Oct. 28, 2025

(54) VERTICAL TRANSISTORS AND METHODS FOR FORMING THE SAME

(71) Applicant: Tokyo Electron Limited, Tokyo (JP)

(72) Inventors: H. Jim Fulford, Albany, NY (US);
Mark I. Gardner, Albany, NY (US);
Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 750 days.

This patent is subject to a terminal disclaimer.

(21) Appl. No.: 17/749,938

(22) Filed: May 20, 2022

(65) Prior Publication Data

US 2023/0378366 A1 Nov. 23, 2023

(51) Int. Cl.
*H10D 30/67* (2025.01)
*H10D 48/36* (2025.01)
*H10D 84/85* (2025.01)
*H10D 99/00* (2025.01)

(52) U.S. Cl.
CPC ....... *H10D 30/6728* (2025.01); *H10D 48/362* (2025.01); *H10D 84/85* (2025.01); *H10D 99/00* (2025.01)

(58) Field of Classification Search
CPC ............. H01L 29/78642; H01L 27/092; H01L 29/66969; H01L 29/7606
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2023/0200065 A1* | 6/2023 | Gardner | H10B 43/27 257/314 |
| 2023/0207660 A1* | 6/2023 | Gardner | H01L 29/66439 |
| 2023/0207667 A1* | 6/2023 | Fulford | H01L 21/823475 257/401 |
| 2023/0378364 A1* | 11/2023 | Fulford | H01L 29/41733 |
| 2024/0105777 A1* | 3/2024 | Fulford | H01L 27/088 |
| 2024/0145595 A1* | 5/2024 | Fulford | H01L 29/775 |

FOREIGN PATENT DOCUMENTS

| | | | |
|---|---|---|---|
| CN | 117135923 A * | 11/2023 | |
| DE | 102023130980 A1 * | 6/2024 | ..... H01L 21/823412 |
| WO | WO-2023173914 A1 * | 9/2023 | |

* cited by examiner

*Primary Examiner* — Michael Lebentritt
(74) *Attorney, Agent, or Firm* — Foley & Lardner LLP

(57) ABSTRACT

A semiconductor device may include a transistor structure. The transistor structure may include a metal structure extending along a vertical direction; a gate dielectric layer around the metal structure; a channel layer around the gate dielectric layer; a first metal electrode disposed below the metal structure and in electrical contact with a first end of the channel layer; a second metal electrode disposed above the metal structure and in electrical contact with a second end of the channel layer; and a third metal electrode disposed above and in electrical contact with the metal structure.

20 Claims, 25 Drawing Sheets

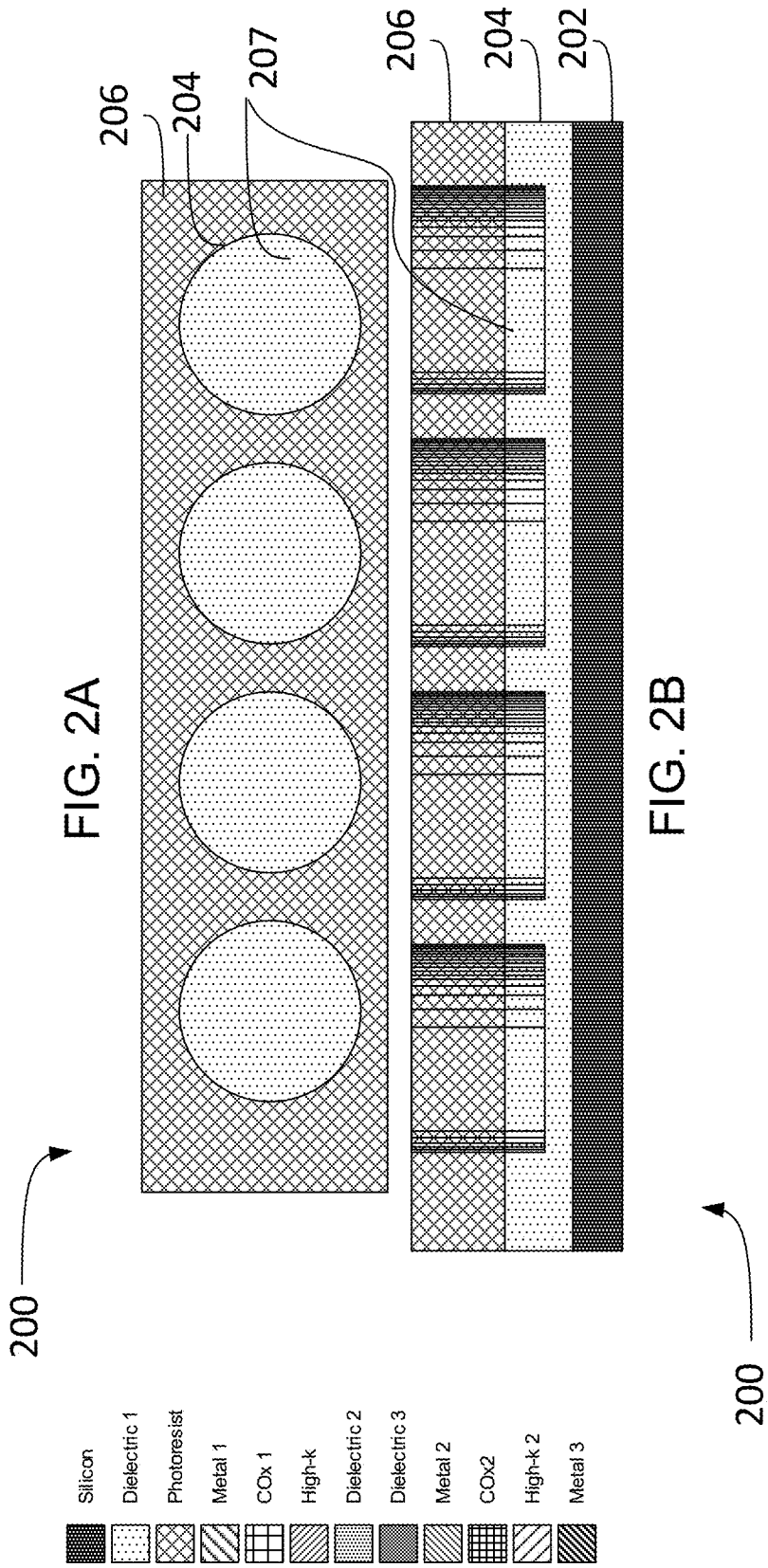

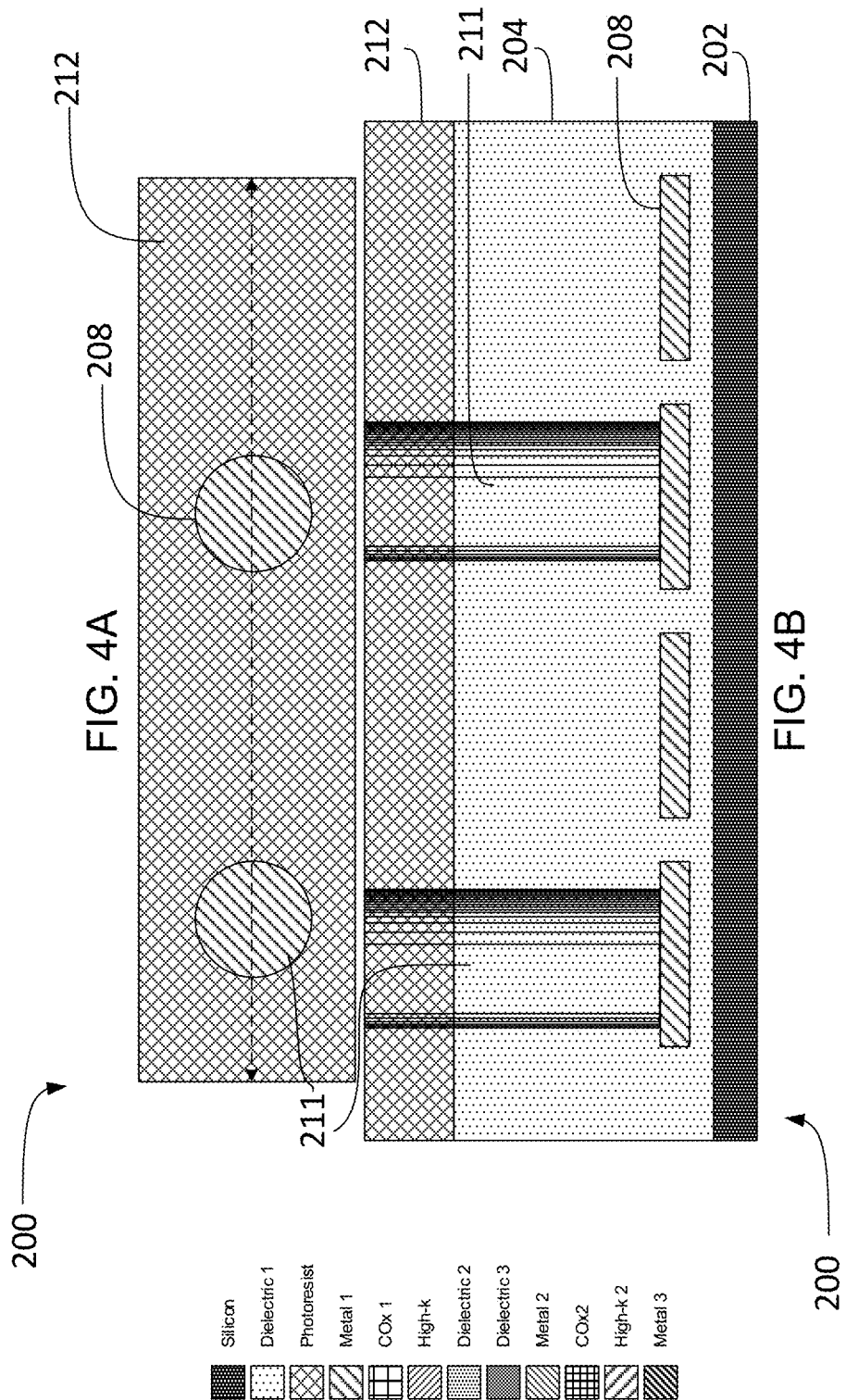

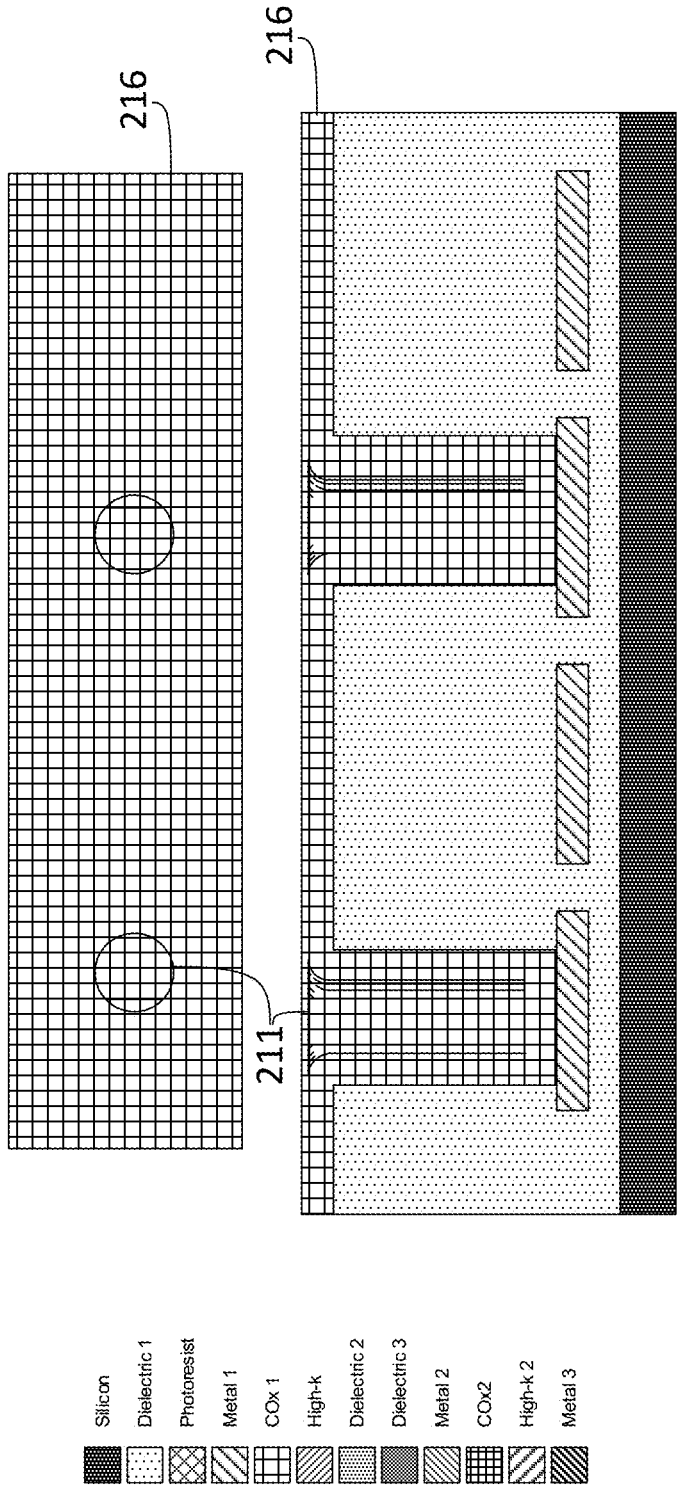

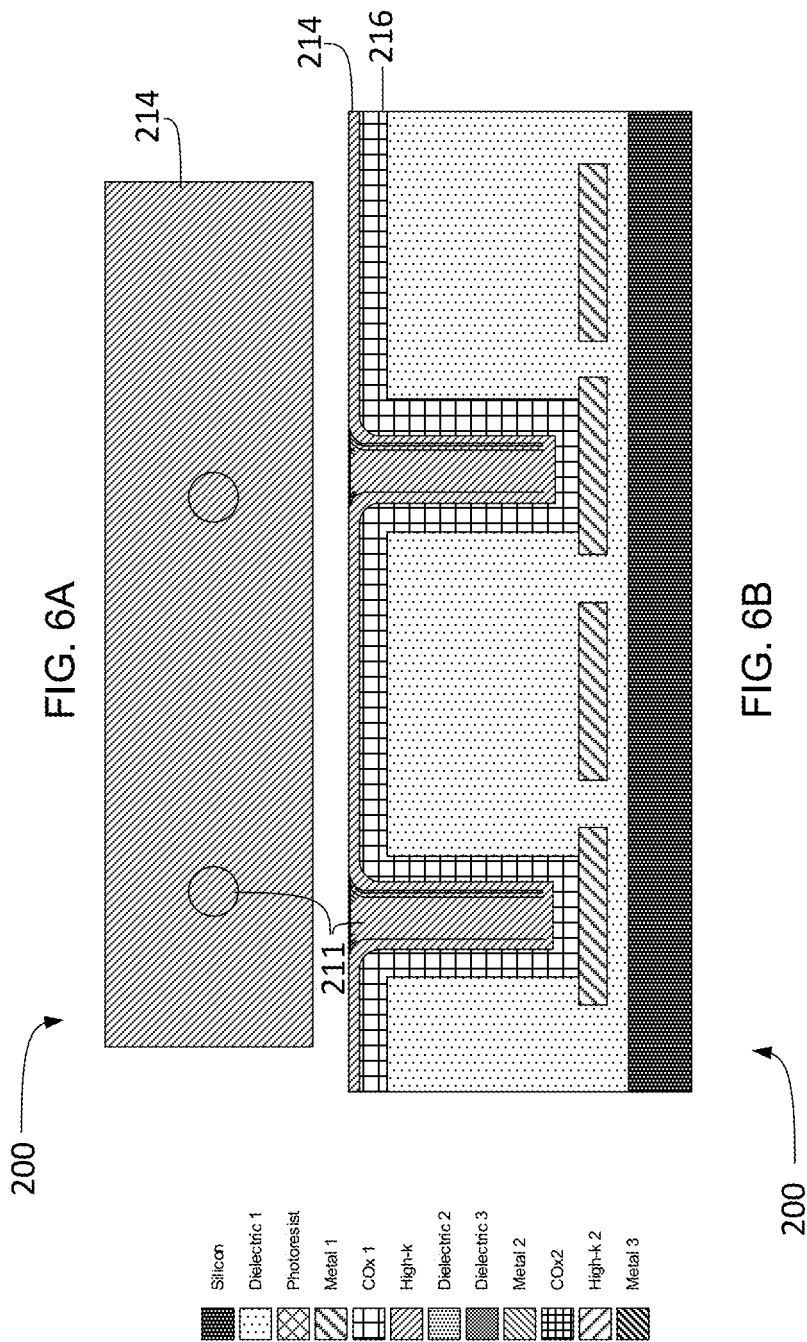

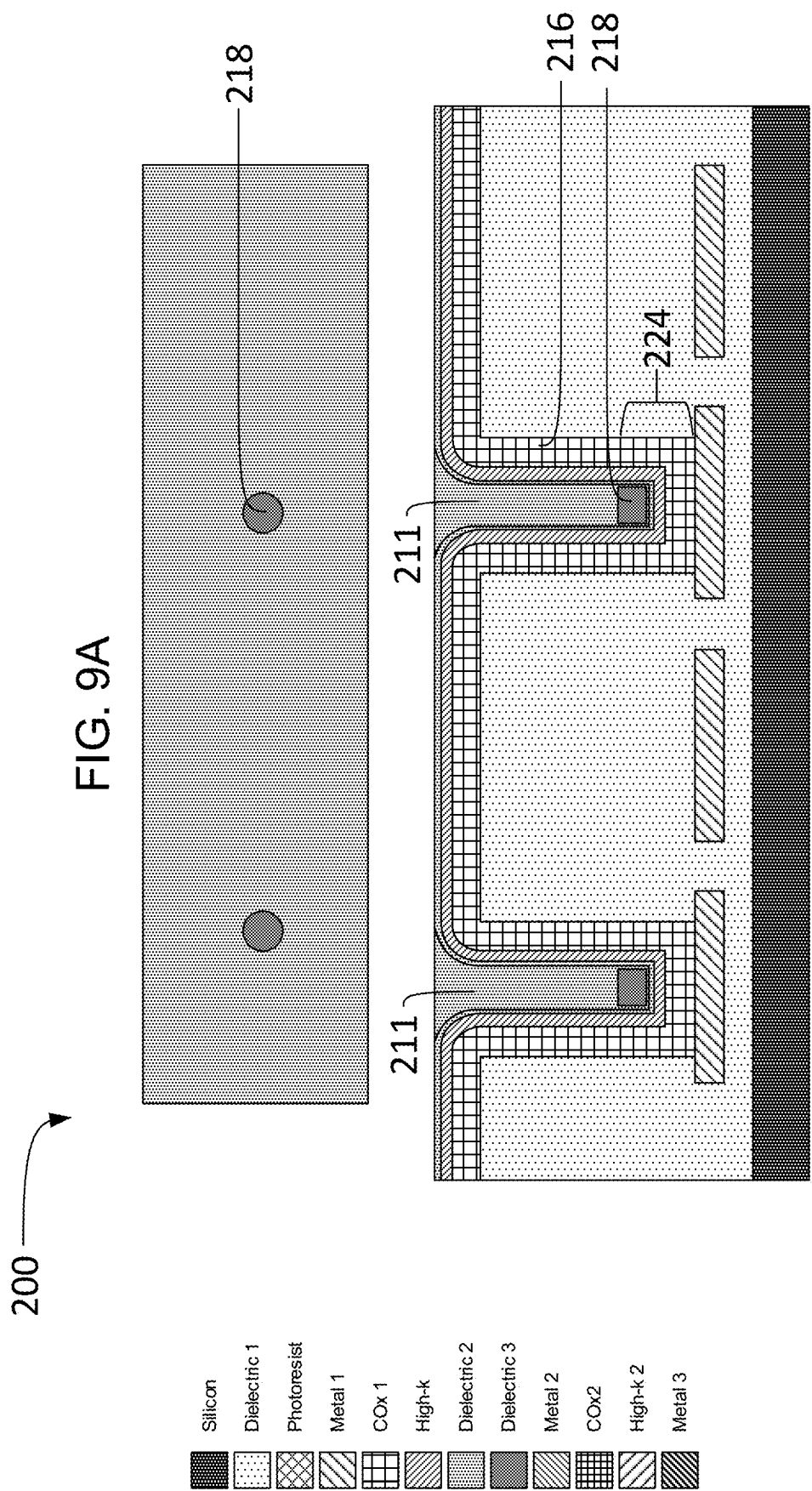

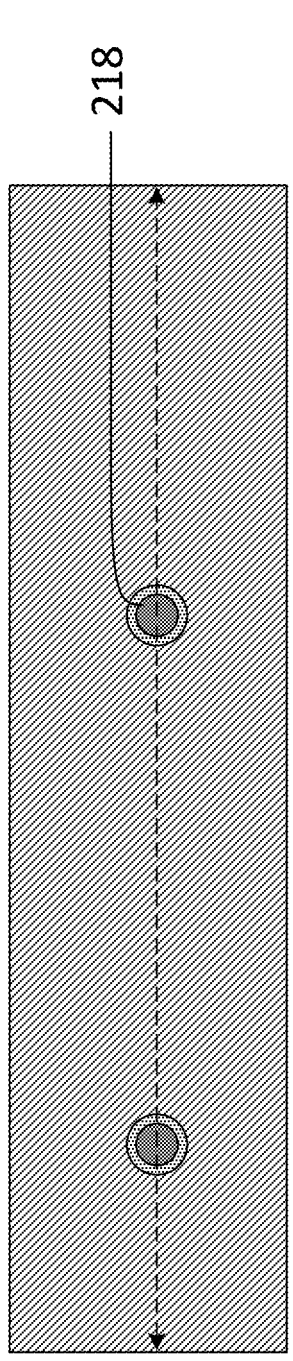
FIG. 10A
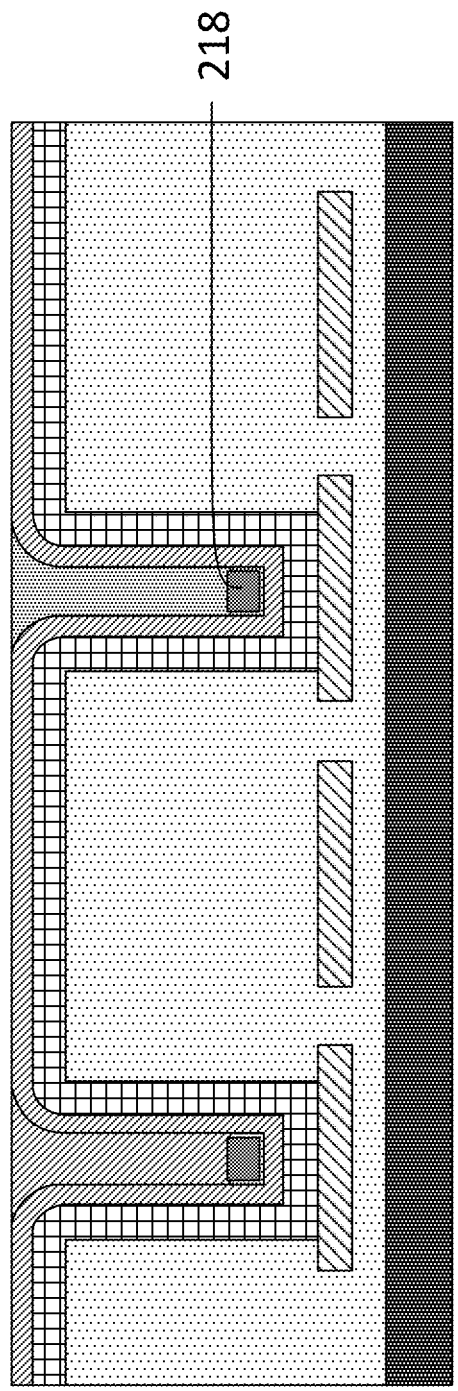
FIG. 10B
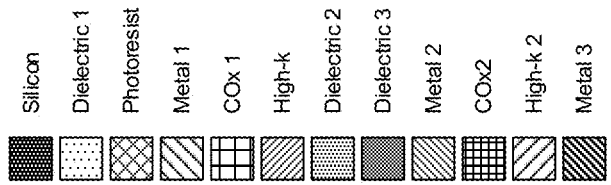

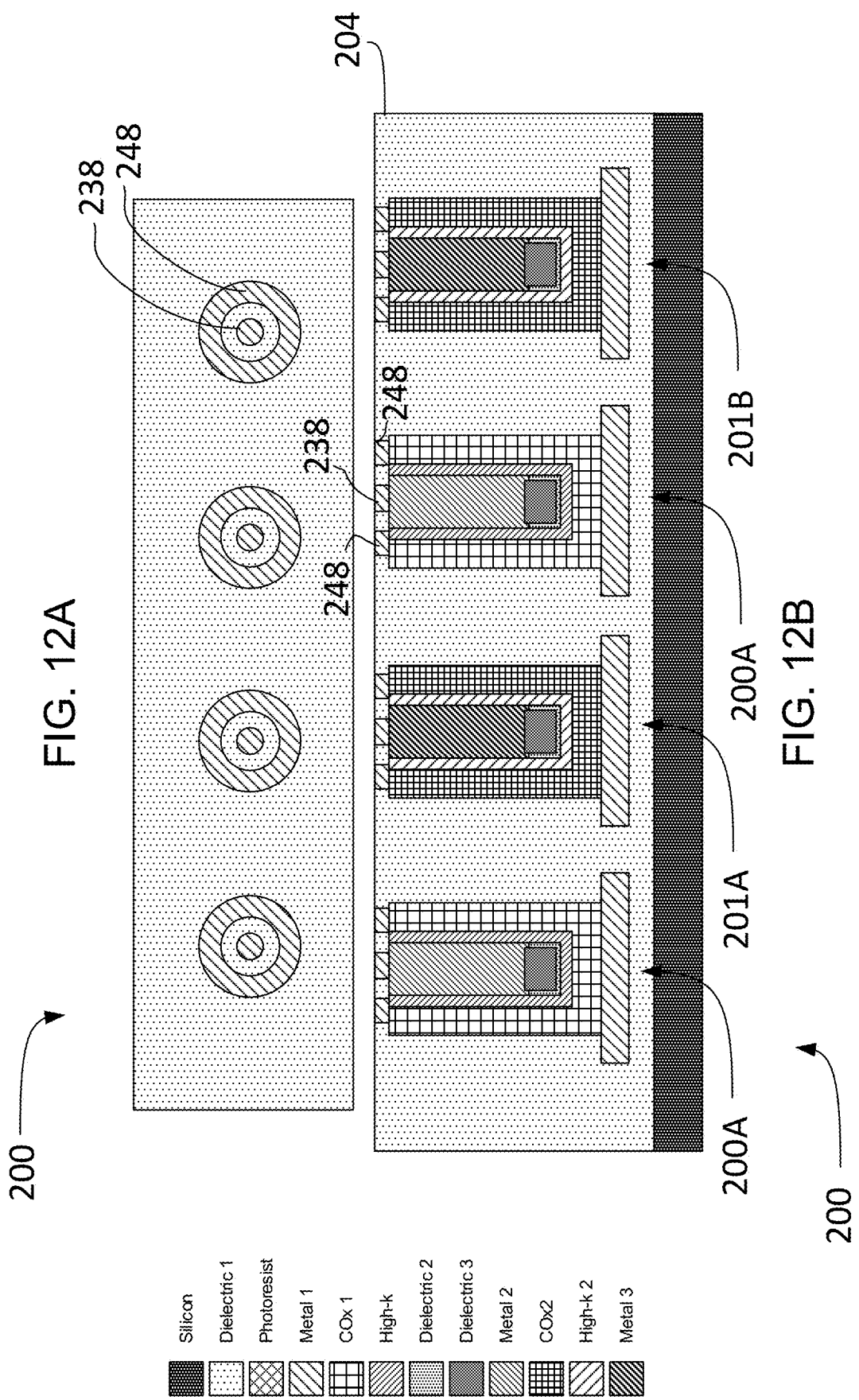

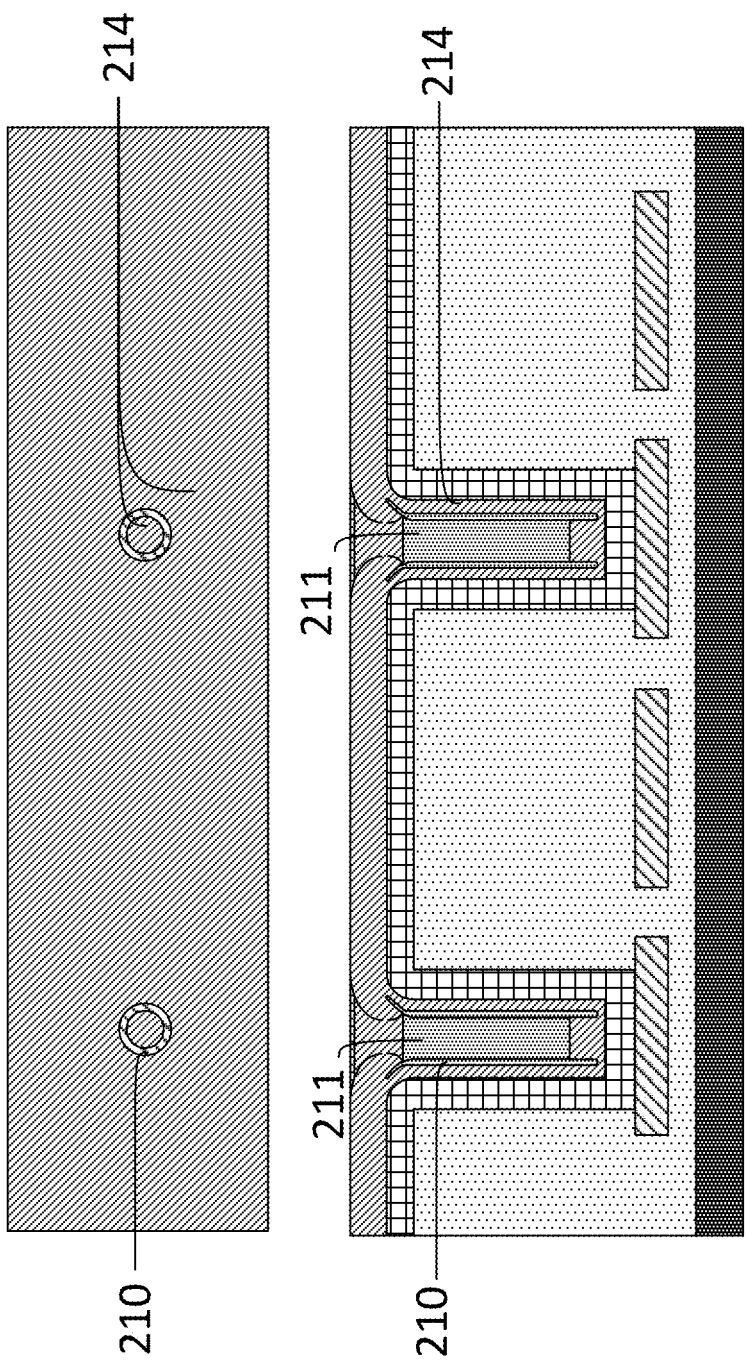

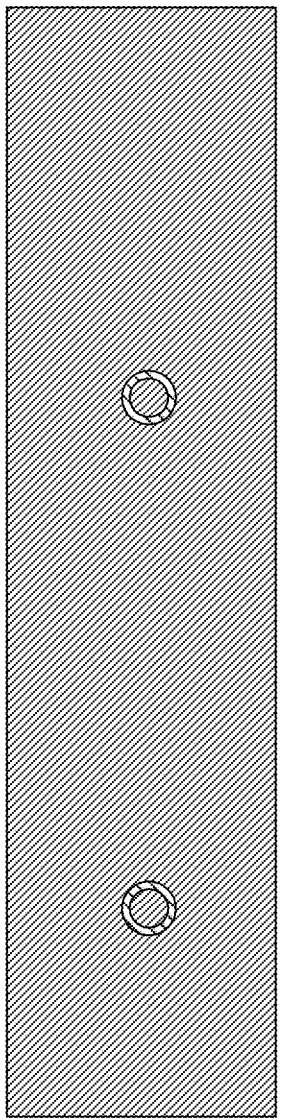
FIG. 16A
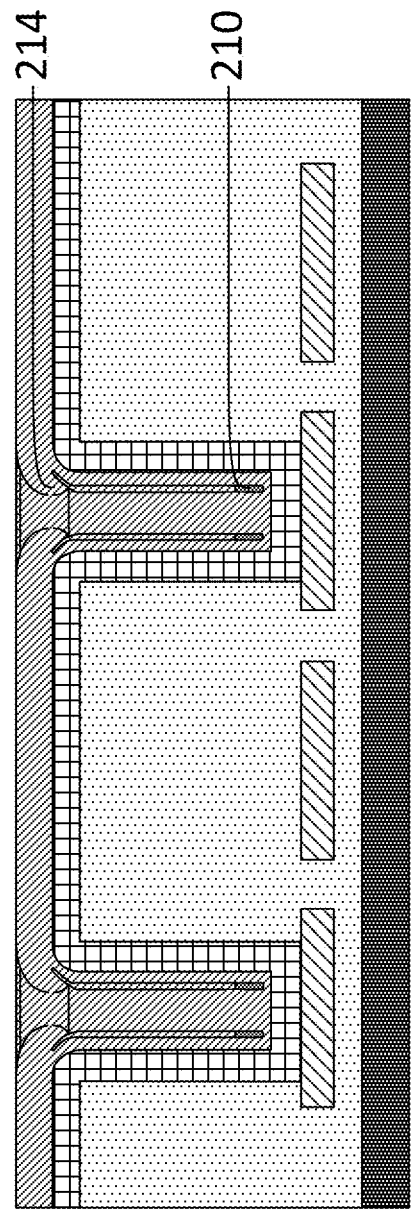
FIG. 16B
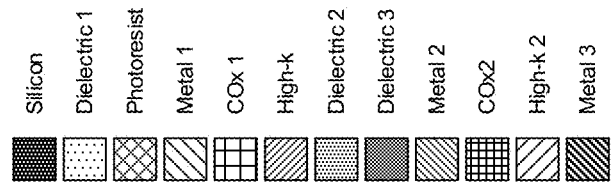

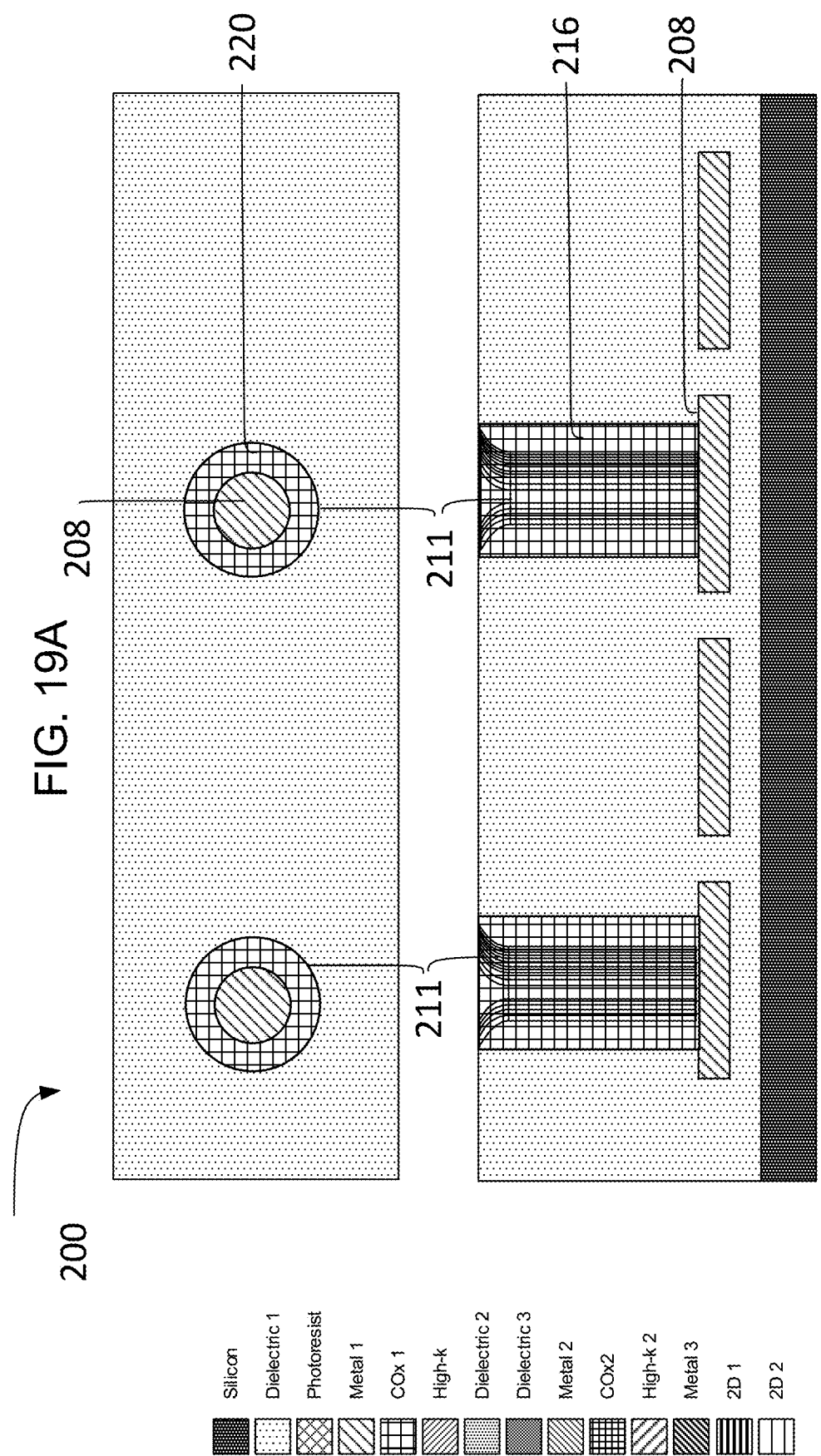

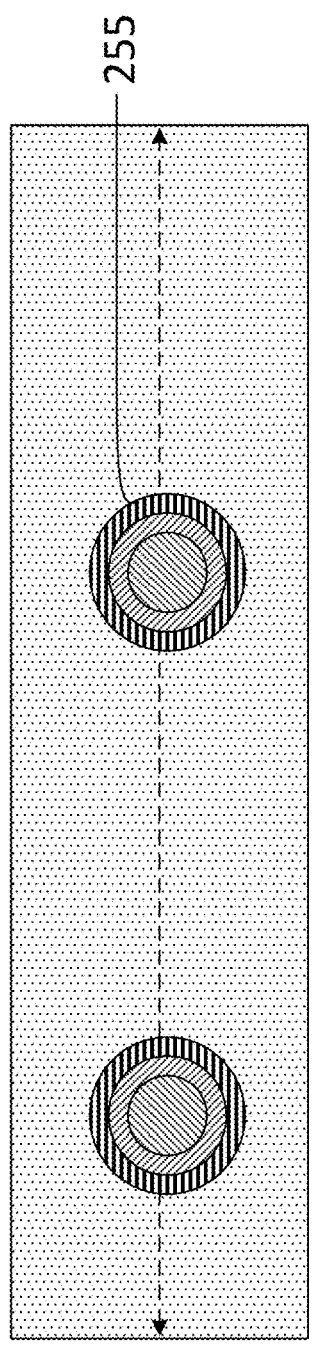
FIG. 21A
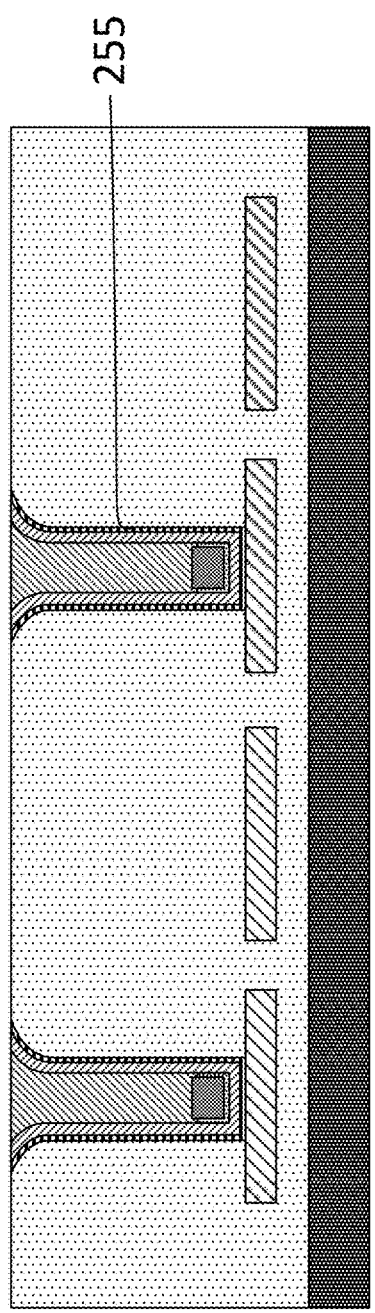
FIG. 21B
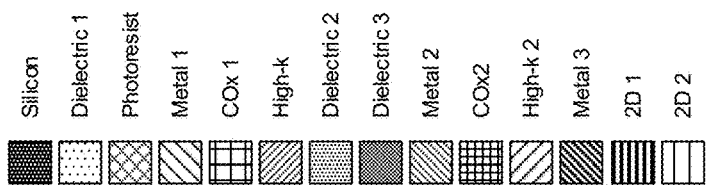

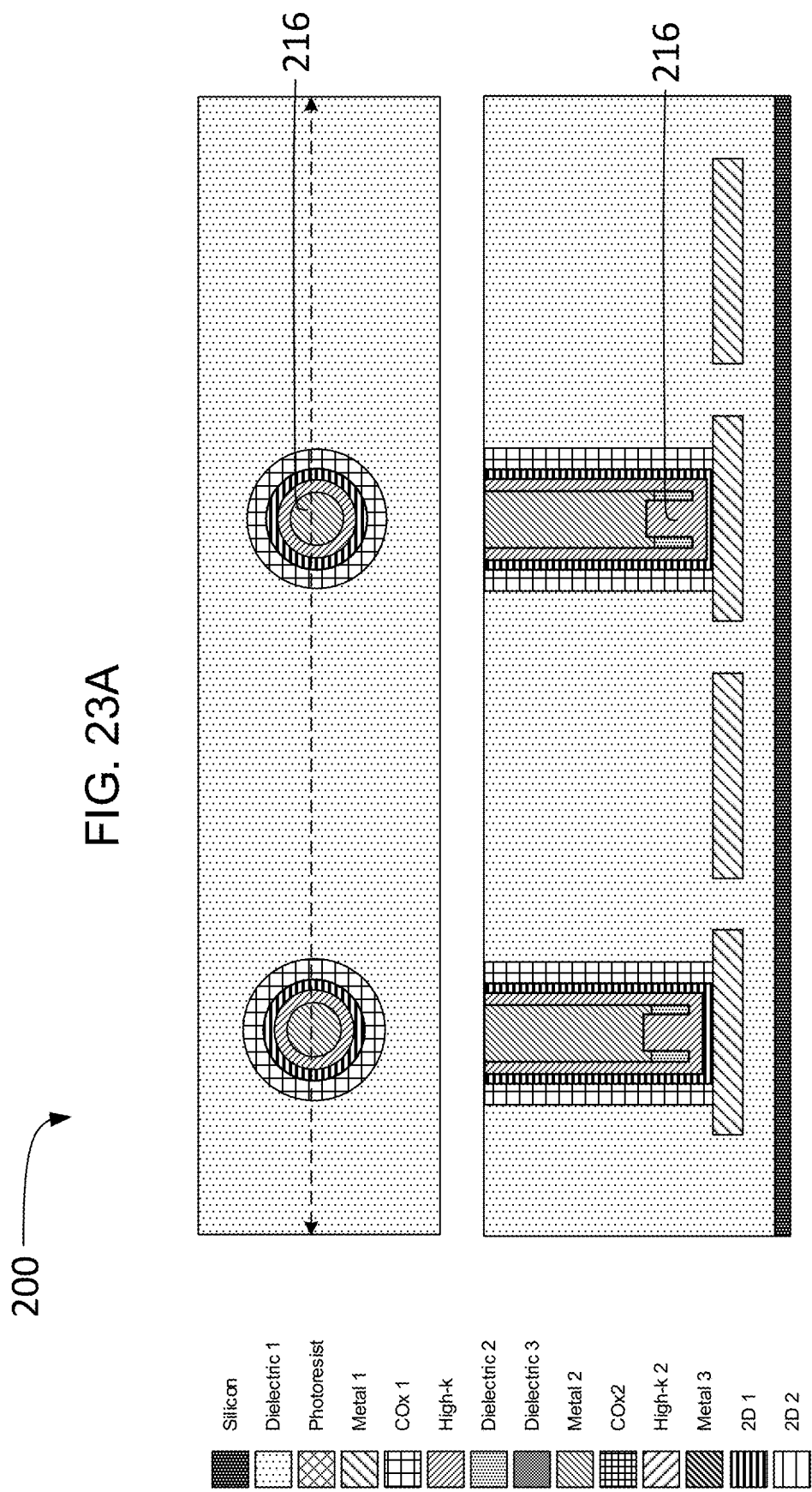

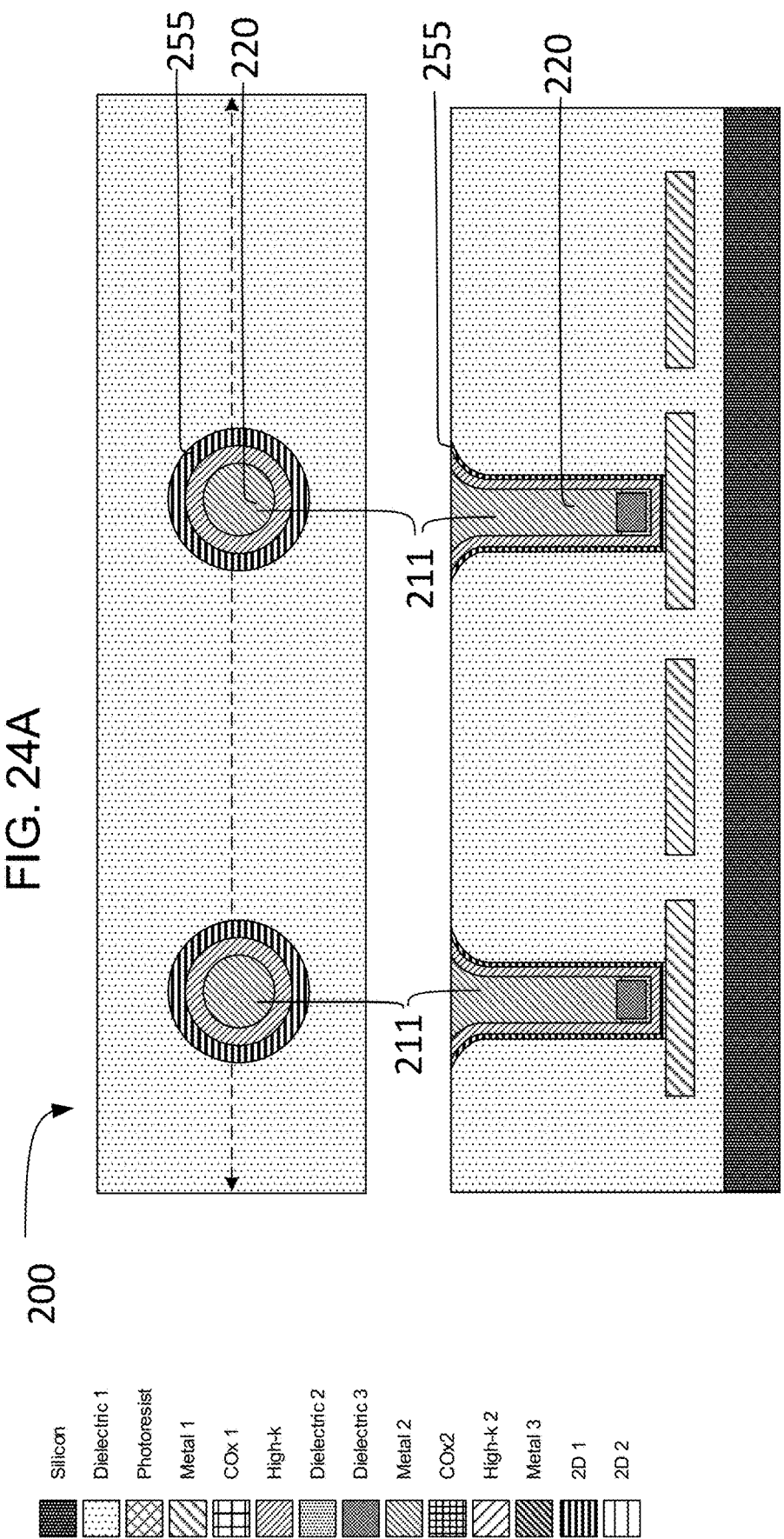

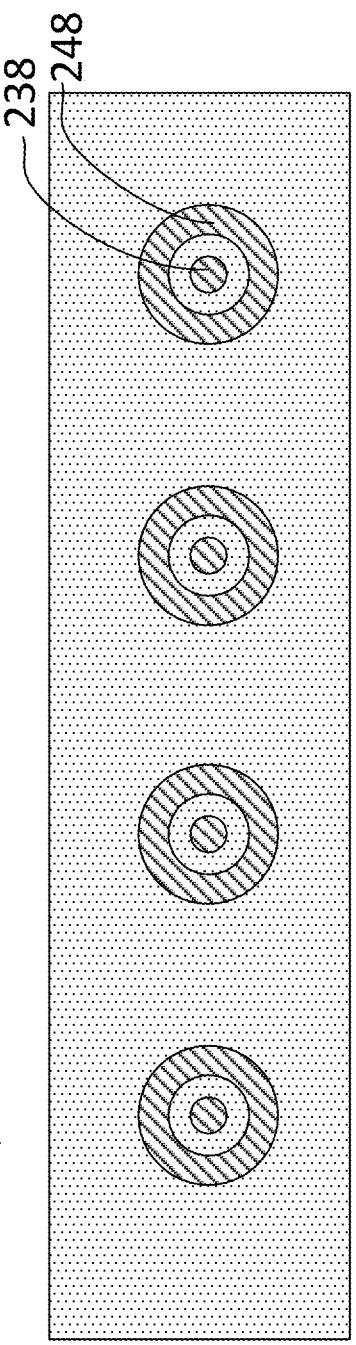
FIG. 25A
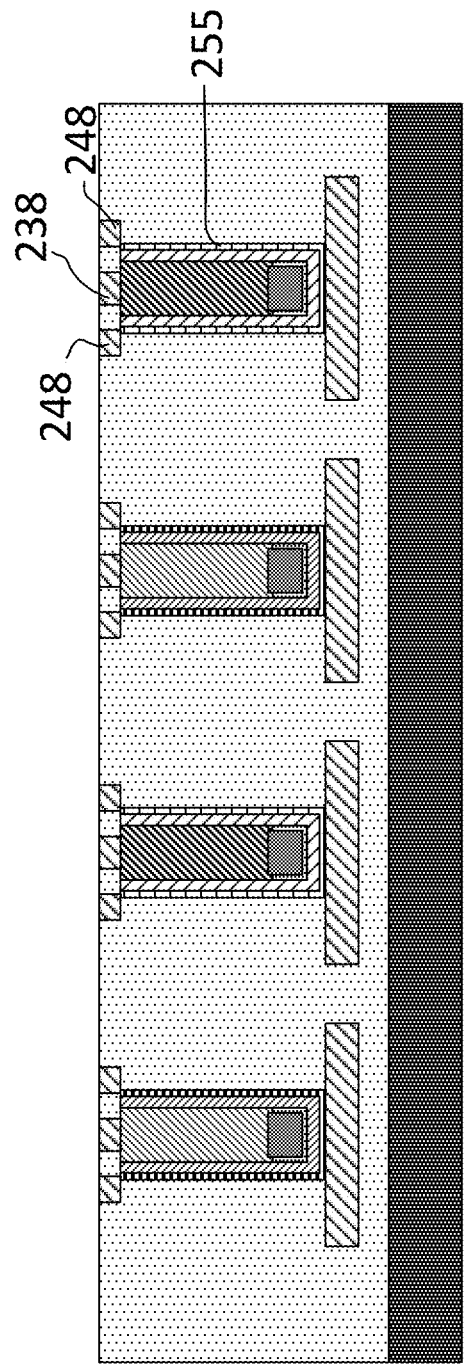
FIG. 25B
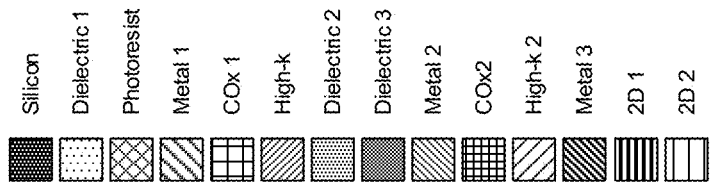

VERTICAL TRANSISTORS AND METHODS FOR FORMING THE SAME

TECHNICAL FIELD

The present disclosure relates generally to the field of manufacturing transistors.

BACKGROUND

Scaling of features in integrated circuits has been a driving force behind the growing semiconductor industry for the past decades. Scaling to smaller features enables an increased density of functional units on a limited substrate surface of a semiconductor chip. For example, shrinking transistor size allows for an increase in the number of memory devices incorporated on a chip, resulting in increased capacity in the manufacture of products. However, driving ever increasing capacity is not without problems. The necessity to optimize the performance of each device is becoming increasingly important.

SUMMARY

One aspect of the present disclosure may be directed to a semiconductor device. The semiconductor device may include a transistor structure. The transistor structure may include a metal structure extending along a vertical direction; a gate dielectric layer at least in part around the metal structure; a channel layer at least in part around the gate dielectric layer; a first metal electrode disposed below the metal structure and in electrical contact with a part of the channel layer; a second metal electrode disposed above the metal structure and in electrical contact with a second end of the part of the channel layer; a third metal electrode disposed above and in electrical contact with the metal structure; and a dielectric structure between the metal structure and the first metal electrode.

The semiconductor device may further include a second transistor structure adjacent to the transistor structure. The second transistor structure may include a second metal structure extending along the vertical direction; a second gate dielectric layer having a part around the second metal structure; a second channel layer having a part around the second gate dielectric layer; a fourth metal electrode disposed below the second metal structure and above the first metal structure, and in electrical contact with a first end of the part of the second channel layer; a fifth metal electrode disposed above the second metal structure and in electrical contact with a second end of the part of the second channel layer; a sixth metal structure disposed above and in electrical contact with the second metal structure; and a second dielectric structure disposed between the second metal structure and the fourth metal electrode.

The channel layer and second channel layer of the semiconductor device may have respectively different conductive types.

The first metal electrode of the semiconductor device may be formed in a solid disk shape, and the second metal electrode may be formed in a ring shape.

The second metal electrode of the semiconductor device may extend around the third metal electrode.

The gate dielectric layer and the channel layer may have a second portion disposed below the metal structure, and also below the dielectric structure.

The semiconductor device may also include a dielectric liner separating the dielectric structure from the gate dielectric layer, at least laterally.

The channel layer of the semiconductor device may also include a two-dimensional (2D) material around the gate dielectric layer and a conductive oxide around the two-dimensional material.

The two dimensional material may have a vertical and horizontal part, each being in physical contact with the conductive oxide material.

The channel layer of the semiconductor device may include, principally, a two dimensional material around the gate dielectric layer.

Another aspect of the present disclosure may be directed to a semiconductor device. The semiconductor device may include a first transistor structure. The first transistor structure may include a first metal structure extending along a vertical direction; a first gate dielectric layer around the first metal structure; a first channel layer around the first gate dielectric layer; a first metal electrode below, and in electrical contact with, the first channel layer; a second metal electrode disposed above the first metal structure and in electrical contact with the first channel layer; a third metal electrode surrounded by the second metal structure and in electrical contact with the first metal structure; and a first dielectric structure lifting the first metal structure away from the first metal electrode. The semiconductor device may also include a second transistor structure. The second transistor structure may include a first metal structure extending along the vertical direction; a second gate dielectric layer around the second metal structure; a second channel layer around the second gate dielectric layer; a fourth metal electrode below, and in electrical contact with, the second channel layer; a fifth metal electrode disposed above the second metal structure and in electrical contact with the second channel layer; a sixth metal electrode surrounded by the fifth metal structure and in electrical contact with the second metal structure; and a second dielectric structure lifting the second metal structure away from the fourth metal electrode.

The first and second channel layer of the semiconductor device may have different conductive types.

The first transistor structure may also include a first dielectric liner separating the first dielectric structure from the first gate dielectric layer, at least laterally. The second transistor structure may also include a second dielectric liner separating the second dielectric structure from the second gate dielectric layer, at least laterally.

The first and second channel layers of the semiconductor device may include a two-dimensional material around the first gate dielectric layer and the second gate dielectric layer, respectively. A first and second conductive oxide may be formed around the two-dimensional materials of the first and second gate dielectric layers, respectively.

The first and second channel layers may principally include respective two-dimensional materials.

Yet another aspect of the present disclosure may be directed to a method for fabricating semiconductor devices. The method may include: forming a first metal electrode at the bottom of an opening of a dielectric layer; lining the opening with a channel layer (which is in electrical contact with the first metal electrode); lining the opening with a gate dielectric layer; forming a dielectric structure above a horizontal portion of the gate dielectric layer; filling a remaining portion of the opening with a metal material to form a gate structure; forming a second metal electrode above the gate structure so the metal electrode electrically contacts the channel layer; and forming a third metal electrode, electrically contacting the gate structure and being surrounded by the second metal electrode.

The step of lining the opening with a channel layer may include depositing a conductive oxide material over the opening; etching horizontal portions of the conductive oxide material; and lining the opening with a two-dimensional material.

The step of further lining the opening with a gate dielectric layer may include depositing a first high-k dielectric material over the opening; depositing a dielectric material over the first high-k dielectric material to form a dielectric liner; and etching horizontal portions of the dielectric liner.

The step of forming a dielectric structure may include selectively depositing a second high-k dielectric material over the first high-k dielectric material; and etching vertical portions of the dielectric liner.

The present solution may utilize 2D materials for forming transistor channels. 2D materials can include, for example, but are not limited to, WS2, WSe2, WTe2, MoS2, MoSe2, MoTe2, HfS2, ZrS2, and TiS2, GaSe, InSe, phosphorene, and other similar materials. These materials can be deposited by an atomic layer deposition (ALD) process and may be about 5-15 angstroms thick, the thinness lending to their name –2D material. 2D material layer can, depending on the material and design, and can have a broader range of thicknesses, such as between 0.2 nm and 3 nm, for example. 2D materials may be annealed during or after the device formation process to recrystallize or grow the crystals and thereby improve electrical characteristics. 2D materials, for example, can be electrically conductive.

Additionally or alternatively, the channels may comprise one or more semiconductive-behaving materials, which may be formed using certain elements that, when combined with oxygen, form a new material that exhibits semiconductive behavior. For example, the semiconductive behaving material can be "turned off" and can have a low or practically no off-state leakage current, and the semiconductive behaving material can be "turned on" and become highly conductive when voltage is applied. Example materials to create an n-type channel for example include, but are not limited to, $In_2O_3$, $SnO_2$, In GaZnO, and ZnO. Example materials that can be used to create a p-type channel may be formed utilizing, for example, SnO. These materials may be further doped to improve the electrical characteristics. These materials may also be referred to as conductive oxides or semiconductive behaving oxides for the purposes of this discussion.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 2A and 2B illustrate a top view and a cross-sectional view of a semiconductor device, respectively, during various fabrication stages, made by the method of FIG. 1, in accordance with some embodiments.

FIGS. 4A and 4B illustrate a top view and a cross-sectional view of a semiconductor device, respectively, during various fabrication stages, made by the method of FIG. 1, in accordance with some embodiments.

FIGS. 5A and 5B illustrate a top view and a cross-sectional view of a semiconductor device, respectively, during various fabrication stages, made by the method of FIG. 1, in accordance with some embodiments.

FIGS. 6A and 6B illustrate a top view and a cross-sectional view of a semiconductor device, respectively, during various fabrication stages, made by the method of FIG. 1, in accordance with some embodiments.

FIGS. 9A and 9B illustrate a top view and a cross-sectional view of a semiconductor device, respectively, during various fabrication stages, made by the method of FIG. 1, in accordance with some embodiments.

FIGS. 10A and 10B illustrate a top view and a cross-sectional view of a semiconductor device, respectively, during various fabrication stages, made by the method of FIG. 1, in accordance with some embodiments.

FIGS. 12A and 12B illustrate a top view and a cross-sectional view of a semiconductor device, respectively, during various fabrication stages, made by the method of FIG. 1, in accordance with some embodiments.

FIGS. 15A and 15B illustrate a top view and a cross-sectional view of a semiconductor device, respectively, during various fabrication stages, made by the method of FIG. 13, in accordance with some embodiments.

FIGS. 16A and 16B illustrate a top view and a cross-sectional view of a semiconductor device, respectively, during various fabrication stages, made by the method of FIG. 13, in accordance with some embodiments.

FIGS. 19A and 19B illustrate a top view and a cross-sectional view of a semiconductor device, respectively, during various fabrication stages, made by the method of FIG. 18, in accordance with some embodiments.

FIGS. 21A and 21B illustrate a top view and a cross-sectional view of a semiconductor device, respectively, during various fabrication stages, made by the method of FIG. 18, in accordance with some embodiments.

FIGS. 23A and 23B illustrate a top view and a cross-sectional view of a semiconductor device, respectively, during various fabrication stages, made by the method of FIG. 18, in accordance with some embodiments.

FIGS. 24A and 24B illustrate a top view and a cross-sectional view of a semiconductor device, respectively, during various fabrication stages, made by the method of FIG. 18, in accordance with some embodiments.

FIGS. 25A and 25B illustrate a top view and a cross-sectional view of a semiconductor device, respectively, during various fabrication stages, made by the method of FIG. 18, in accordance with some embodiments.

DETAILED DESCRIPTION

Figure 1:
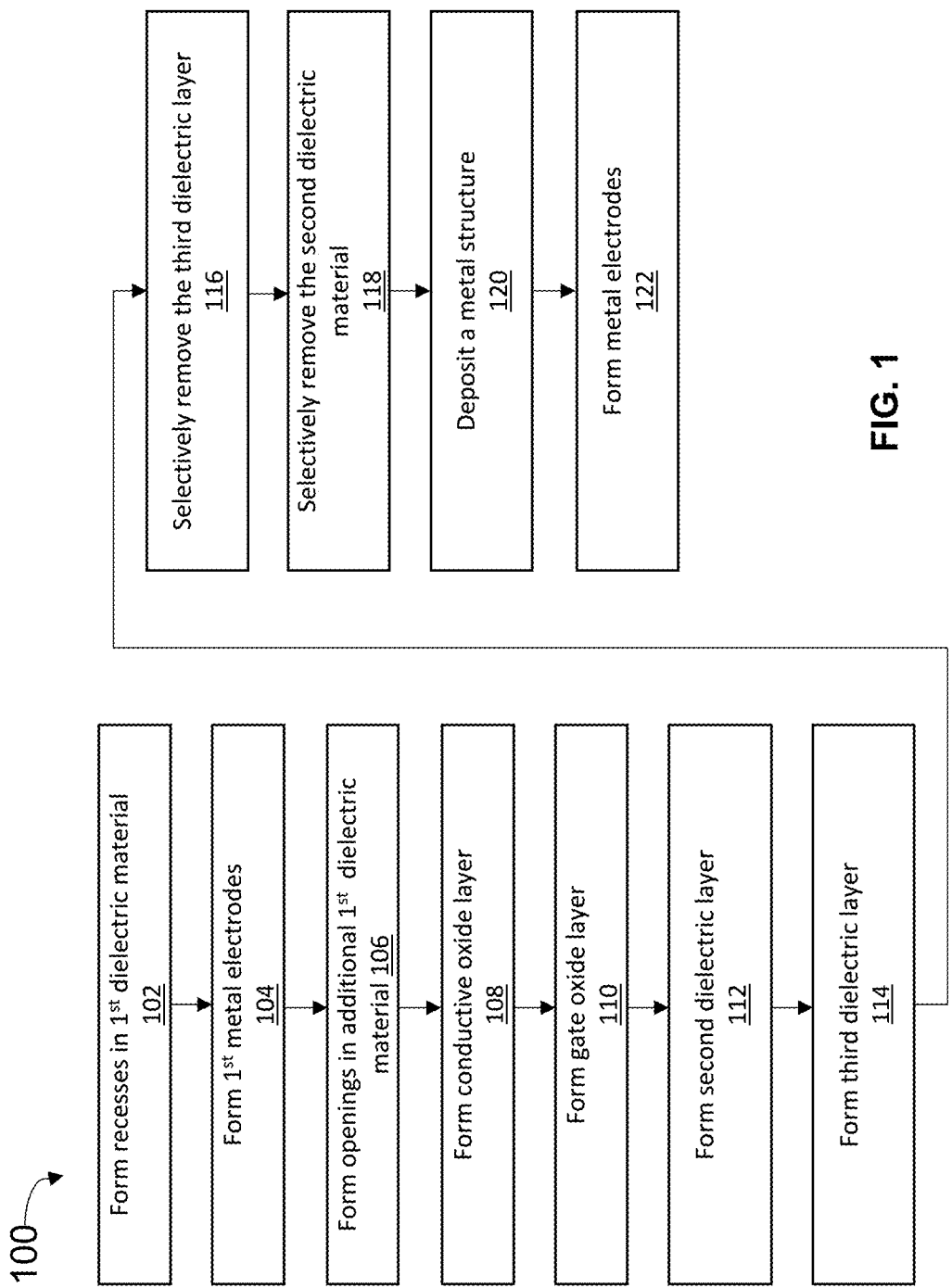
FIG. 1 is a flow chart of an example method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more transistor structures having a central vertical metal structure. In some embodiments, the vertical metal structure may occupy an innermost level of an opening forming a transistor structure and operatively function as the gate of said transistor structure. Based on such a vertical metal structure, advantageously, the transistor structures, as disclosed herein, may be formed as channel-all-around (CAA) or channel around gate (CAG) transistor structures, where a channel layer may wrap around a vertical metal gate structure. In one aspect, any number of the disclosed vertical metal structures can be laterally (e.g., side-by-side) arranged with each other and vertically stacked on top of one another, thereby forming an array of transistor structures having improved characteristics in an area efficient manner. For example, with two different conductive types of the disclosed transistor structure stacked on top of one another, a complementary field-effect-transistor structure can be formed. In one aspect, an arrangement of the channel layer formed around the metal structures can be flexibly configured. For example, the channel layer can have a single material (e.g., a conductive oxide material) or plural materials (e.g., a conductive oxide material wrapping around a two-dimensional (2D) material). In general, conductive oxide materials/2D materials can allow significant boost in performance relative to silicon (Si), such that transistor structures disclosed herein may have improved performances or characteristics (e.g., improved transconductance (gm), improved gain bandwidth (Ft), improved saturation current (Idsat), etc.).

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry.

FIG. 1 illustrates a flowchart of an example method 100 for forming a semiconductor device (e.g., a transistor) based on a vertical metal structure. For example, the transistor may be a vertical transistor with a channel layer wrapping around or otherwise surrounding at least a portion of the generally vertical metal structure that also operatively functions as a gate of the transistor. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with top views and cross-sectional views of an example semiconductor device 200 at various fabrication stages as shown in FIGS. 2A to 12A and FIGS. 2B to 12B, respectively, which will be discussed in further detail below. It should be understood that the semiconductor device 200, shown in FIGS. 2A to 12B, may include a number of other devices such as inductors, fuses, capacitors, coils, etc., while remaining within the scope of the present disclosure.

In brief overview, the method 100 starts with operation 102 of forming a number of recesses in a first dielectric material. The method 100 continues to operation 104 of forming a number of first metal electrodes in the recesses, respectively. In various embodiments, the first metal electrodes may each be formed in a disk shape. The method 100 proceeds to operation 106 of forming a number of first openings in an additional first dielectric material. The method 100 proceeds to operation 108 of forming a conductive oxide layer. In some embodiments, the conductive oxide layer 216 may be surrounded by the first metal electrode (when viewed from the top). The method 100 proceeds to operation 110 of removing the gate oxide layer. The method 100 proceeds to operation 112 of forming a second dielectric layer, which may be a liner layer to protect the gate oxide layer 214 during one or more subtractive (e.g., etching) process. The method 100 proceeds to operation 114 of forming a third dielectric layer. The method 100 proceeds to operation 116 selectively removing the third dielectric material (e.g., to leave a spacer of the third dielectric material over the first metal electrode). The method 100 proceeds to operation 118 of selectively removing the second dielectric material. The method 100 proceeds to operation 120 of forming a number of metal structures (e.g., generally vertical metal structures) in the openings. The method 100 proceeds to operation 122 of forming a number of second metal electrodes and a number of third metal electrodes above the vertical metal structures. In various embodiments, the second metal electrode may be formed in the ring-based shapes (e.g., concentric disk based shapes). In various embodiments, the second metal electrode may surround or otherwise enclose the third metal electrode.

Corresponding to operation 102 of FIG. 1, FIG. 2A is a top view of the semiconductor device 200 in which a number of recesses 207 are formed in a first dielectric material 204. The dielectric material may be formed over a substrate 202 (e.g., a crystalline silicon a glass substrate, etc.) at one of the various stages of fabrication, and FIG. 2B is a corresponding cross-sectional view of the semiconductor device 200, in accordance with various embodiments.

As shown in FIG. 2B, the dielectric material 204 is formed over the substrate 202, and a first patternable layer (e.g., a photoresist material) 206 is further formed over the first dielectric material 204. The recesses 207 are formed to extend into the first dielectric material 204 with a certain depth, Di. In various embodiments, the recesses 207 may each be formed in a generally circular shape, e.g., a disk shape as shown in the top view of FIG. 2A. Further, the different recesses 207 may be laterally spaced apart from one another, which allows the recesses 207 to define the footprints of respective vertical transistors. In various embodiments, the recesses 207 may be formed by one or more etching processes performed on the first dielectric material 204 based on the first patternable layer 206. For example, the first patternable layer 206 may be first formed over the first dielectric material 204 (each of which is deposited as a blanket layer), the first patternable layer 206 may be etched to form a number of patterns, and those patterns formed in the first patternable layer 206 are then transferred to the first dielectric material 204 through at least one etching process. The etching process may be anisotropic and/or isotropic.

In various embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding.

In various embodiments, the first dielectric material 204 includes at least one insulation material, which can electrically isolate neighboring active structures (e.g., metal electrodes which will be formed below) from each other. The insulation material may be an oxide, such as a silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. An anneal process may be performed once the insulation material is formed. Following the deposition of the first dielectric material 204 and the first patternable layer 206 with patterns, a dry etch or a wet etch process including, e.g., dilute hydrofluoric (DHF) acid, may be performed to etch the first dielectric material 204 to form the recesses 207.

In various embodiments, the semiconductor device may be formed over one or more additional semiconductor devices (e.g., in a stacked or staggered configuration). Some embodiments may be formed over interconnect levels, which may connect the semiconductor device to similar semiconductor device, memories, power or ground planes, etc. The one or more recesses may be formed along a grid in a first plane (e.g., the plane depicted in FIG. 2A), which may, advantageously, simplify masking and routing operations. Alternatively or in addition, some recesses may be staggered therein, which may, advantageously, increase a transistor density.

Figures 3A, 3B:
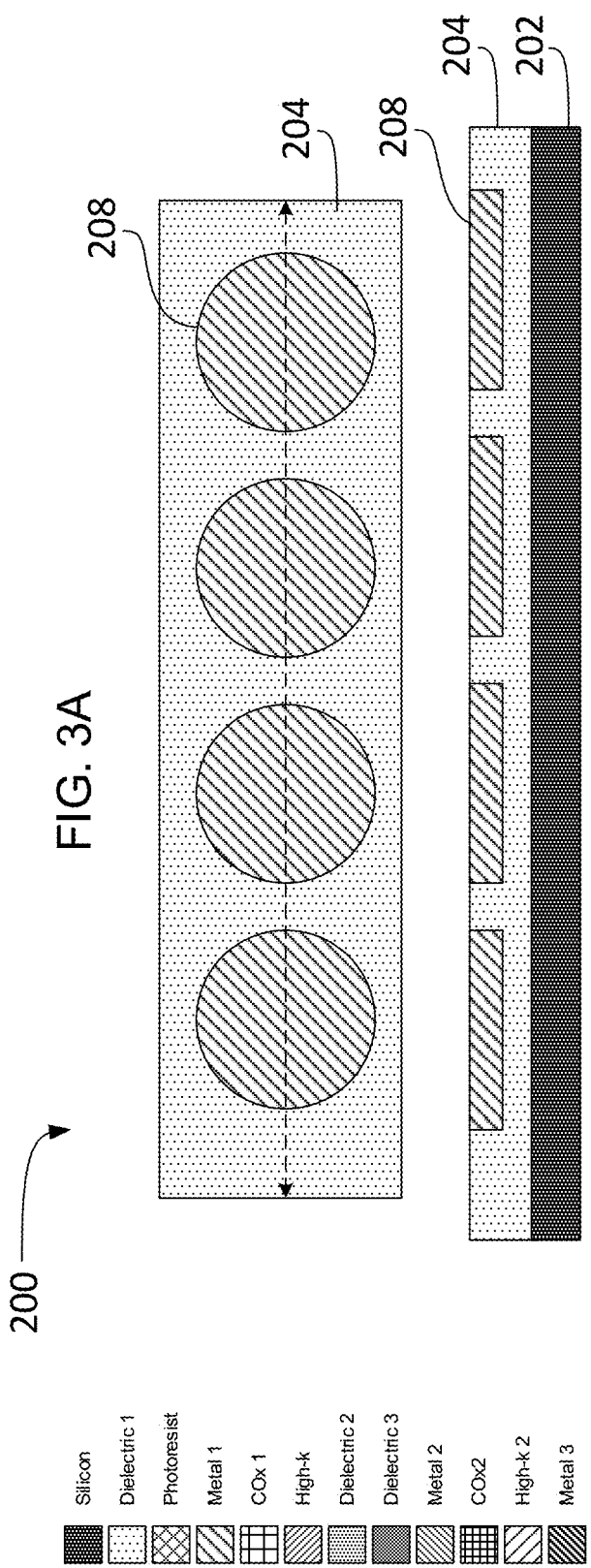
FIGS. 3A and 3B illustrate a top view and a cross-sectional view of a semiconductor device, respectively, during various fabrication stages, made by the method of FIG. 1, in accordance with some embodiments.

Corresponding to operation 104 of FIG. 1, FIG. 3A is a top view of the semiconductor device 200 in which a number of first metal electrodes 208 are formed at one of the various stages of fabrication, and FIG. 3B is a corresponding cross-sectional view of the semiconductor device 200, in accordance with various embodiments. FIG. 4B is a corresponding cross-sectional view of the semiconductor device 200, in accordance with various embodiments.

After forming the recesses, the first patternable layer is removed. Next, at least the recesses are filled with a first metal material. The first metal material may include copper, aluminum, or the like. The first metal material may be deposited by CVD, physical vapor deposition (PVD), atomic layer deposition (ALD), and/or other suitable metal filling process. Next, a polishing or planarization process (e.g., a chemical mechanical polishing (CMP) process) may be performed to remove excessive first metal material until a coplanar surface is formed by the first metal electrodes 208 and the first dielectric material 204. In various embodiments, the first metal electrodes 208 can inherit the dimensions and profiles of the recesses, and thus, the first metal electrodes 208 can have a disk shape, as shown in the top view of FIG. 3A.

Corresponding to operation 106 of FIG. 1, FIG. 4A is a top view of the semiconductor device 200 in which a number of first openings 211 are formed through additional first dielectric material 204 disposed over the previously discussed first dielectric material 204. The first openings 211 and various additional openings herein may be similar to the recesses discussed with reference to FIGS. 2A-3B. References to openings rather than recesses (or vice versa) is not intended to limit the embodiments described herein. In some embodiments, the previous dielectric material and the additional dielectric material may be different materials, such as a second dielectric material (not depicted). An interstitial layer, coating, etc. may be provided between the first dielectric material 204 and any additional material (e.g., additional first dielectric material 204) which may encourage their adhesion, enable differing material types to avoid diffusion, etc.

As shown in FIG. 4B, a second patternable layer 212 (e.g., a photoresist material) is further formed over the first dielectric material 204. The first openings 211 are formed to extend through at least the first dielectric material 204. In various embodiments, the first openings 211 may each be formed inside a corresponding one of the first metal electrodes 208, as shown in the cross-sectional view of FIG. 4A. The first openings 211 may be configured to generally align with the first metal electrodes 208 (e.g., as defined by the first recesses). In some embodiments, the first openings 211 may be or a lesser dimension than the first metal electrodes 208. Advantageously, such embodiments may demonstrate improved tolerance of skew, over etch of the first opening 211, etc. In various embodiments, the first openings 211 may of equal or larger dimension than the first metal electrodes 208. Advantageously, such embodiments may enable an increase in transistor density.

In various embodiments, the first openings 211 may be formed by one or more etching process performed on the first dielectric material 204 based on the second patternable layer 212. For example, the second patternable layer 212 may be first formed over the first dielectric material 204 (each of which is deposited as a blanket layer), the second patternable layer 212 may be etched to form a number of patterns, and those patterns formed in the second patternable layer 212 are then transferred to the first dielectric material 204 through at least one etching process. The etching process described herein may be anisotropic and/or isotropic.

Corresponding to operation 108 of FIG. 1, FIG. 5A is a top view of the semiconductor device 200 in which a conductive oxide layer 216 is formed over the surface of the semiconductor device, and FIG. 5B is a corresponding cross-sectional view of the semiconductor device 200, in accordance with various embodiments. In various embodiments, the conductive oxide layer 216 may operatively function as channel of a corresponding vertical transistor. In some embodiments, the conductive oxide layer 216 may be formed using, for example, CVD, PECVD, LPCVD, and the like. Further, the conductive oxide layer 216 may be doped through one or more annealing processes to have a certain conductive type, e.g., n-type or p-type. The conductive oxide layer 216 may be selected for electron mobility, susceptibility to an electric field imposed by a gate, etc. For example, the conductive oxide layer 216 may include indium oxide (e.g., $In_2O_3$), tin dioxide ($SnO_2$), zinc oxide (ZnO), or InGaZnO for n-type conductive oxide layers 216, and tin oxide (SnO) for p-type conductive oxide layers 216.

Corresponding to operation 110 of FIG. 1, FIG. 6A is a top view of the semiconductor device 200 in which a gate oxide layer 214 is formed over the surface of the semiconductor device. FIG. 6B is a corresponding cross-sectional view of the semiconductor device 200, in accordance with various embodiments.

In various embodiments, the gate oxide layer 214 is deposited over the conductive oxide layer 216, e.g., as a blanket layer. For example in FIG. 6B, the gate oxide layer 214 can overlay the top surface of the semiconductor device and extend along the sidewalls of each of the first openings 211. The gate oxide layer 214 may be formed of a single high-k dielectric material, multiple different high-k dielectric materials, or multiple similar high-k dielectric materials. Example high-k dielectric materials include a metal oxide or a silicate of Hf, Al, Zr, La, Mg, Ba, Ti, Pb, and combinations thereof. The gate oxide layer 214 can be deposited using any suitable method, including, for example, molecular beam deposition (MBD), atomic layer deposition (ALD), PECVD, and the like. In some embodiments, the gate oxide layer 214 may optionally include a substantially thin oxide (e.g., SiOx) layer.

Figures 7A, 7B:
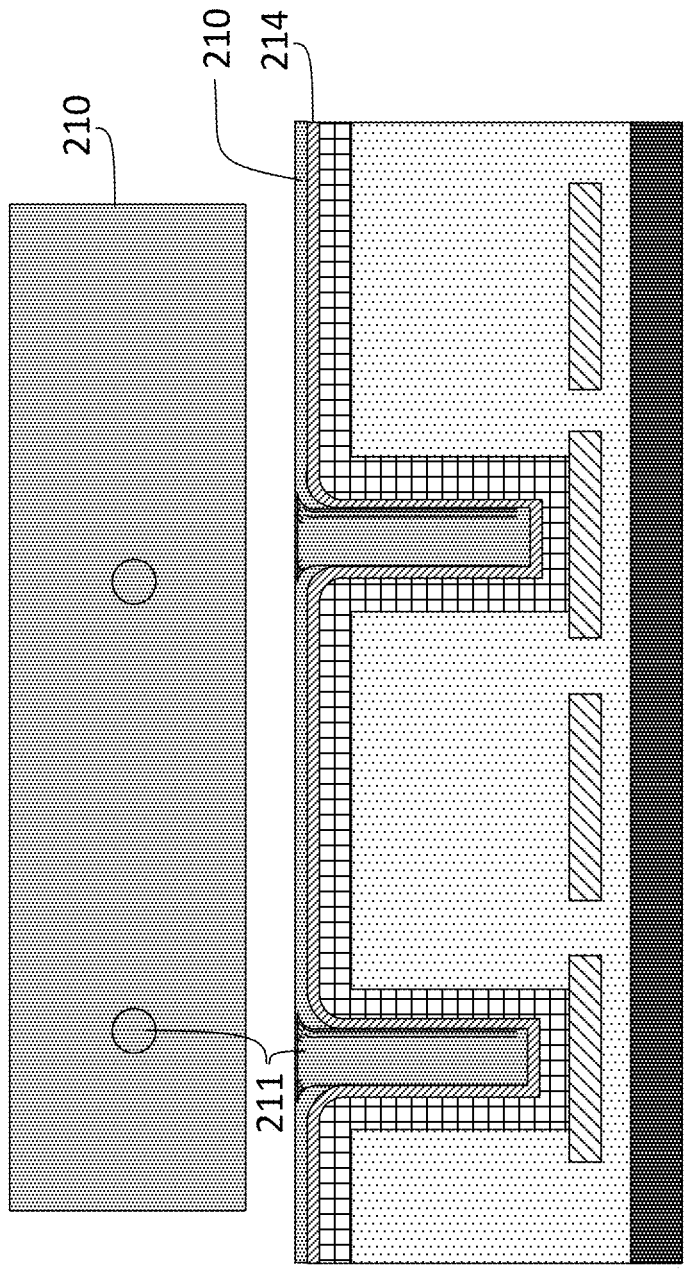
FIGS. 7A and 7B illustrate a top view and a cross-sectional view of a semiconductor device, respectively, during various fabrication stages, made by the method of FIG. 1, in accordance with some embodiments.

Corresponding to operation 112 of FIG. 1, FIG. 7A is a top view of the semiconductor device 200 in which a second dielectric material 210 is formed over the surface of the semiconductor device 200, and FIG. 7B is a corresponding cross-sectional view of the semiconductor device 200, in accordance with various embodiments.

The second dielectric material 210 is deposited to form a liner around the first openings 211. In various embodiments, the thickness of the liner may be less than 20 nm, which may facilitate a later removal of all or a portion of the second dielectric material 210. Thicker applications (e.g., applications filling the opening), liners made from alternative materials, etc., may also be utilized. For example, in some embodiments, the second dielectric 210 or other materials may be used in combination to form a liner (e.g., laminations thereof). In some embodiments, the second dielectric material 210 may be selected for a high etch sensitivity from the gate oxide layer 214 to facilitate a later removal of the second dielectric material 210 (e.g., may minimize or eliminate damage done to the gate oxide layer 214 during later processing steps related to the second dielectric material 210). In some embodiments, the second dielectric material 210 may be formed by an ALD or other deposition process.

In various embodiments, operation 112 can be omitted. For example, in some embodiments wherein another dielectric is not received over the gate oxide layer 214 (as is discussed with regards to FIGS. 8A to 8B) or is provided or removed via a selective process (e.g., placing, directional deposition, etc.), the liner may be omitted, such that method 100 may proceed from, for example, operation 112 to operation 114, 116, or 120. Alternatively or additionally, operation 112 may be performed on one or more other occasions during method 100. For example, a liner may be formed between various materials herein discussed (e.g., to avoid damaging adjacent materials from etchants or other subtractive processes lacking sufficient selectivity, to avoid damage from outgassing, diffusion, or other interaction between various materials, etc.).

Figures 8A, 8B:
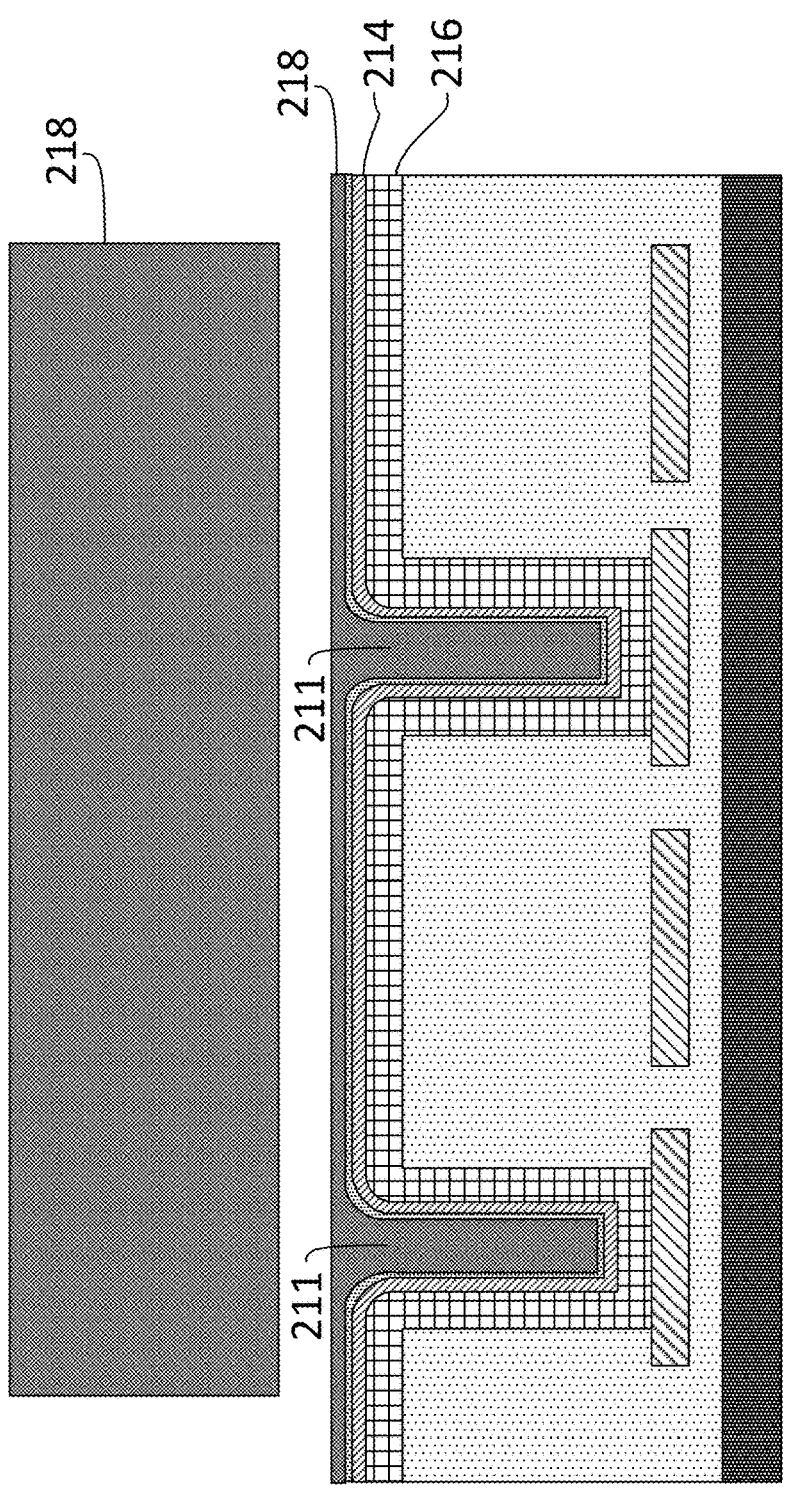
FIGS. 8A and 8B illustrate a top view and a cross-sectional view of a semiconductor device, respectively, during various fabrication stages, made by the method of FIG. 1, in accordance with some embodiments.

Corresponding to operation 114 of FIG. 1, FIG. 8A is a top view of the semiconductor device 200 in which a third dielectric material 218 is formed over the surface of the semiconductor device, and FIG. 8B is a corresponding cross-sectional view of the semiconductor device 200, in accordance with various embodiments.

The third dielectric material 218 may be formed by a high density plasma chemical vapor deposition (HDP-CVD), a flowable CVD (FCVD), etc. In some embodiments, the third dielectric material 218 may be selectively deposited (e.g., directionally) in order to avoid adhesion to the sidewalls of the first opening 211. A layer of third dielectric material disposed along an upper surface of the semiconductor device may thereafter be planarized (e.g., by a CMG/CMP process) in order to leave a layer of dielectric material at a bottom of the first opening 211.

As will be discussed with regards to FIG. 9A, the third dielectric material 218 may be a low-k material to reduce gate/source capacitance relative to a high gate capacitance, a silicon oxide, etc. In some embodiments, the third dielectric material 218 may be omitted. For example, the material or geometry of the gate oxide layer 214, the conductive oxide layer 216, or the first metal electrodes 208 may be configured to reduce capacitance between the first metal electrode 208 and the upper bottom surface of the first opening 211 (e.g., the gate, as will be discussed with reference to FIG. 11A). Alternatively or in addition, various embodiments may omit the third dielectric material 218 and may tolerate an increase gate to drain/source capacitance and increased risk of electrical shorting between the first metal electrode 208 and the gate.

Corresponding to operation 116 of FIG. 1, FIG. 9A is a top view of the semiconductor device 200 in which the third dielectric material 218 is removed, and FIG. 9B is a corresponding cross-sectional view of the semiconductor device 200, in accordance with various embodiments.

Following the forming of the third dielectric material 218, the third dielectric material 218 may be selectively removed such as by an CMG/CMP process and/or an etching process (e.g., isotropic etching), which (e.g., based on an etchant exposure time) remove all but a portion of the third dielectric material 218 at the bottom of the first opening 211. Alternatively or additionally, a third dielectric material 218 may be formed at another process step (e.g., along a bottom surface of the first opening 211).

The selective removal may leave a spacer between the gate oxide layer 214 and the first opening 211. The dimension of such a spacer may be varied according to a desired gate to source/drain capacitance (e.g., increasing the z-height of the spacer is correlated with a decrease in capacitance). The dimension of the spacer may also be varied base on a selected material. For example, the selection of a low-k material may enable decreased capacitance at a given dimension, or may allow for similar capacitance for a smaller spacer dimension. Advantageously, a low z-height spacer may enable a greater vertical portion of the channel (e.g., comprising the conductive oxide layer 216) to be adjacent to a first metal structure occupying the first opening 211 (e.g., a gate), such that the gate may better control the state of the channel. If the transistor is an enhancement mode transistor, this may allow the gate to turn on a greater portion of the channel, however, the inability of the gate to turn off any portion of the channel may be undesirable in at least some applications. Thus, for some embodiments of the device, the ungated channel portion 224 may greatly reduce the on state or may require very high voltage levels to enable an adequate on state current (e.g., a relatively low current). Consequently, in some embodiments, the transistor is a depletion mode transistor. The minimization of the spacer dimension may result in an ability to turn off a greater portion of the channel, and thus may result in decreased leakage in an off state, which may be desirable to increase an on state current (e.g., a relatively high current).

Corresponding to operation 118 of FIG. 1, FIG. 10A is a top view of the semiconductor device 200 in the third dielectric layer is removed, and FIG. 10B is a corresponding cross-sectional view of the semiconductor device 200, in accordance with various embodiments.

A portion of the second dielectric material 210 (e.g., the liner), may be removed at operation 118. The second dielectric material 210 may be removed by a process which be selective to avoid damaging the gate oxide or the gate oxide dimension may enable a portion thereof to be removed/damaged during operation 118. Further, the removal process may be selective to avoid the removal of the third dialectic. For example, an additional liner may be horizontally overlaid over the surface of the semiconductor, and thereafter removed along an upper surface of the semiconductor device, leaving a protective layer over the third semiconductor material to protect the third semiconductor material during from the removal of the second semiconductor material. Alternatively or in addition, the material of the third semiconductor material may be selected to avoid excess removal of the third semiconductor.

Figures 11A, 11B:
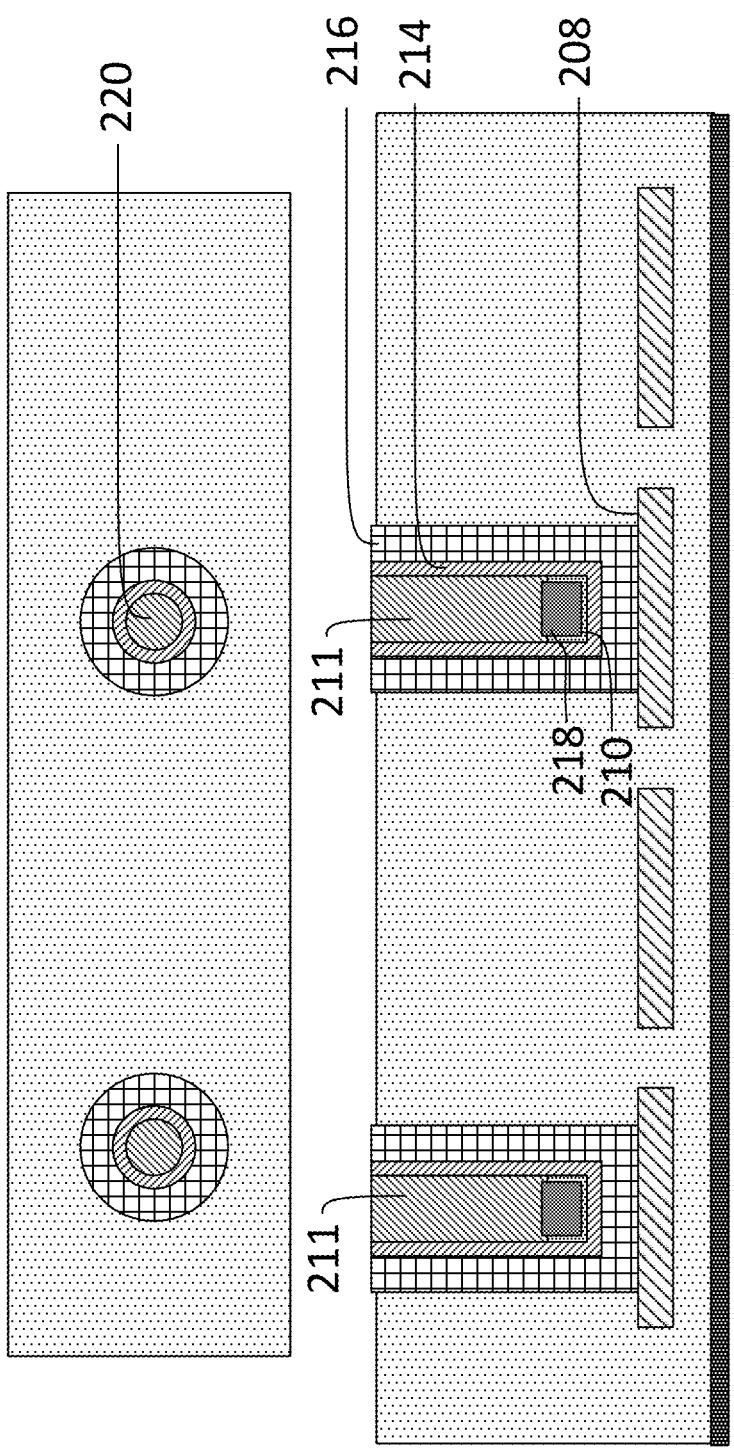
FIGS. 11A and 11B illustrate a top view and a cross-sectional view of a semiconductor device, respectively, during various fabrication stages, made by the method of FIG. 1, in accordance with some embodiments.

Corresponding to operation 120 of FIG. 1, FIG. 11A is a top view of the semiconductor device 200 in which a first metal structure 220 is formed within a remaining portion of the first opening 211 of the semiconductor device 200, and FIG. 11B is a corresponding cross-sectional view of the semiconductor device 200, in accordance with various embodiments.

At operation 120, the first openings 211 are filled with a metal material. In various embodiments, the metal structures 220 can inherit the dimensions and profiles of the first openings 211, (as reduced by the addition of the gate oxide layer 214, the conductive oxide layer 216, etc.) and thus, the first metal structure 220 may extend from an upper surface of the semiconductor device 200 towards the first metal electrodes 208. In various embodiments, the metal material may include a work function layer that is configured to form, at least in part, the gate of a corresponding vertical transistor. For example, the second metal material may be a p-type work function layer, an n-type work function layer, multilayers thereof, or combinations thereof. Example p-type work function layers may include TiN, TaN, Ru, Mo, Al, WN, ZrSi2, MoSi2, TaSi2, NiSi2, WN, other suitable p-type work function materials, or combinations thereof. Example n-type work function layers may include Ti, Ag, TaAl, TaAlC, TiAlN, TaC, TaCN, TaSiN, Mn, Zr, other suitable n-type work function materials, or combinations thereof. The work function layer(s) may be deposited by CVD, physical vapor deposition (PVD), ALD, and/or other suitable process.

In various embodiments, the first metal structure 220 and the conductive oxide layer 216 may operatively function as the gate and the channel of a corresponding vertical transistor, respectively. In various embodiments, the metal structure 220 can inherit the dimensions and profiles of the first openings 211, (as reduced by the addition of the gate oxide layer 214, the conductive oxide layer 216, etc.) and thus, the first metal structure 220 may extend from an upper surface of the semiconductor device 200 towards the first metal electrodes 208. Any of the gate oxide layer 214, the conductive oxide layer 216, the second dielectric layer 210, or the third dielectric layer 218 may separate the first metal structure 220 from the first metal electrode 208 which may allow a gate to source/drain potential to form in a completed semiconductor device 200 (e.g., a vertical transistor.)

Following the deposition of the metal material, a polishing or planarization process (e.g., a chemical mechanical polishing (CMP) process) may be performed to remove excessive metal material until a coplanar surface is formed by the metal structures 220 and the first dielectric material 210.

Corresponding to operation 122 of FIG. 1, FIG. 12A is a top view of the semiconductor device 200 in which additional electrodes are formed over the surface of the semiconductor device 200, and FIG. 12B is a corresponding cross-sectional view of the semiconductor device 200, in accordance with various embodiments.

In various embodiments, one or more additional electrodes may be formed over the semiconductor device 200. For example, a second metal electrode 238 may be electrically connected to the first metal structure 220, and may function as a gate electrode. A third metal electrode 248 may be formed over the conductive oxide layer 216 and may function as a drain or source electrode. The numbering of the electrodes and other components (e.g., first, second third, etc.) is not intended to denote an order of operation or position. In some embodiments, the second and third electrodes may be formed simultaneously (e.g., by a single mask). In some embodiments, the second 238 and third metal electrodes 248 may be formed following the first metal electrode 208 (e.g., in an embodiment, performing the operations of method 100 in a sequence opposite of the listed sequence of FIG. 1).

In some embodiments, a further dielectric layer may be formed over the surface of the semiconductor device 200, and second and third openings may be formed in that dielectric layer, wherein the second 238 and third metal electrodes 248 are formed. Such an embodiment may isolate the surface of the semiconductor device 200 which may prevent electrical interactions between portions thereof (e.g., gate oxide, conductive channel, first metal structure). The further dielectric material may be of any type. For example, the further dielectric material may be the same material as the first dielectric material 204. In some embodiments, the further dielectric layer may be formed following the second 238 and third metal electrodes 248, and may have further openings created therein for interconnects, additional electrodes of stacked transistors, etc.

The intermediate process steps forming openings for the second 238 and third electrodes 248 are not depicted, but may be similar to operation 102 or 106. For example, the first further dielectric material may be formed over surface of the semiconductor device and a patternable layer (e.g., a photoresist material) may be further formed over the further dielectric material. The openings formed to extend through the dielectric material and stop at the upper surface of the conductive oxide layer 216, gate electrode, and first metal structure 220. In various embodiments, the third opening may be formed in a closed-loop profile (e.g., a ring-based shape), and the second opening may be formed inside a corresponding third opening. In various embodiments, the openings may be formed by one or more etching process performed on the dielectric material based on the patternable layer. For example, the patternable layer may be first formed over the dielectric material (each of which is deposited as a blanket layer), the patternable layer may be etched to form a number of patterns, and those patterns formed in the patternable layer are then transferred to the first dielectric material through at least one etching process. The etching process forming the openings may be anisotropic and/or isotropic.

In various embodiments, the dielectric material includes at least one insulation material, which can electrically isolate neighboring active structures (e.g., metal electrodes which will be formed below) from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. An anneal process may be performed once the insulation material is formed.

Following the deposition of the dielectric material and the patternable layer with patterns, a dry etch or a wet etch process including, e.g., dilute hydrofluoric (DHF) acid, may be performed to etch the dielectric material.

After forming the openings, the patternable layer is removed. Next, the openings are filled with another metal material. The metal material may include copper, aluminum, or the like. The metal material may be deposited by CVD, physical vapor deposition (PVD), atomic layer deposition (ALD), and/or other suitable metal filling process. Next, a polishing or planarization process (e.g., a chemical mechanical polishing (CMP) process) may be performed to remove excessive first metal material until a coplanar surface is formed by the second metal electrodes 228, the third metal electrodes 248, and the dielectric material. In various embodiments, the second metal electrodes 238 can inherit the dimensions and profiles of the second openings and the third metal electrodes 248 can inherit the dimensions and profiles of the third openings, and thus, each of the second metal electrodes 238 may have a ring-based shape enclosed by a corresponding one of the third metal electrodes 248, as shown in the top view of FIG. 12A.

By repeating operations 102 to 120 of the method 100 (FIG. 1), a stacked vertical transistor structure can be formed. Alternatively or additionally, additional vertical transistors may be formed laterally adjacent to the depicted transistor. Either of the vertically or horizontally disposed transistors may be formed into more complex logic designs. For example, the pair of adjacent vertical transistors may be alternatively formed as N type and P type such that they paired sets may comprise a complimentary pair of transistors. In some embodiments, the pairs of transistors may be of similar construction. In some embodiments, the pairs of transitory may be of differencing construction For example, one of the paired sets (e.g., the n-type transistor) may have an intentionally increased capacitance to cause the paired set to have relatively similar switching speed, or one of the devices may have an intentionally lowered electron mobility to force a rave condition to reliably resolve to a given state. Additional variants are discussed henceforth, and may further be combined in complementary pairs of transistors, or logic having additional or less complexity. One example of additional transistors 201A, 201B is depicted alternating between transistors 200A, 200B depicted in FIGS. 12A and 12B.

Figure 13:
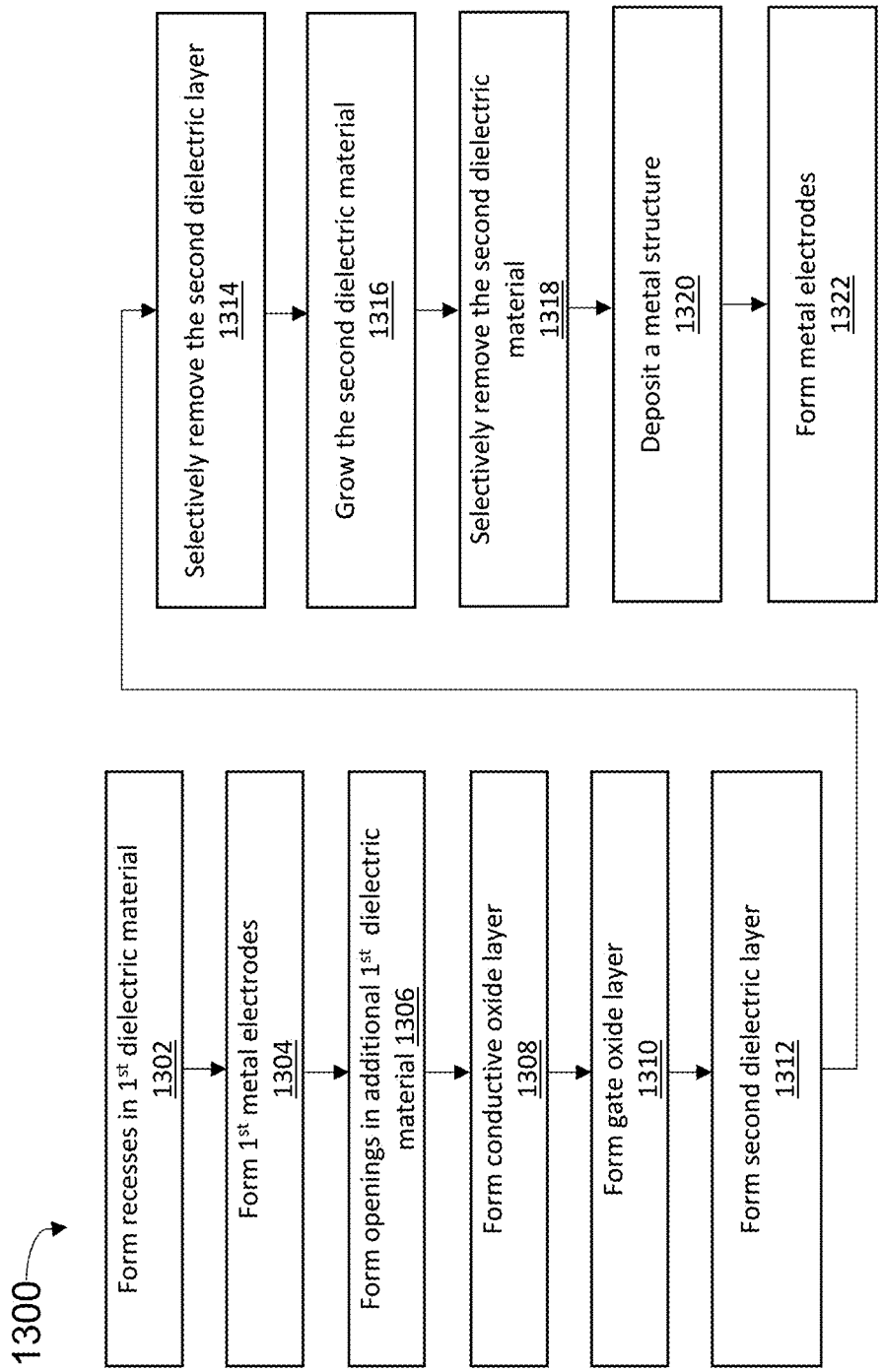
FIG. 13 is another flow chart of an example method for making a semiconductor device, in accordance with some embodiments.

FIG. 13 is another flowchart of another example method 1300 for forming a semiconductor device 200 (e.g., a transistor) having a generally vertical metal structure. For example, the transistor may be a vertical transistor with a channel layer wrapping around or otherwise surrounding at least a portion of the vertical metal structure that also operatively functions as a gate of the transistor. It is noted that the method 1300 is merely an example, and is not intended to limit the present disclosure. Accordingly, it is understood that additional operations may be provided before, during, and after the method 1300 of FIG. 13, and that some other operations may only be briefly described herein.

In various embodiments, operations of the method 1300 may be associated with top views and cross-sectional views of an example semiconductor device 200 at various fabrication stages as shown in FIGS. 14A to 17B, respectively, which will be discussed in further detail below. It should be understood that the semiconductor device 200, shown in FIGS. 14A to 17B, may include a number of other devices such as inductors, fuses, capacitors, coils, etc., while remaining within the scope of the present disclosure.

In brief overview, the method 1300 starts with operation 1302 of forming a number of recesses in a first dielectric material. The method 1300 continues to operation 1304 of forming a number of first metal electrodes in the recesses, respectively. In various embodiments, the first metal electrodes may each be formed in a disk-based shape. The method 1300 proceeds to operation 1306 of forming a number of first openings in an additional first dielectric material. The method 1300 proceeds to operation 1308 of forming a conductive oxide layer. In some embodiments, the conductive oxide layer 216 may be surrounded by the first metal electrode (when viewed from the top). The method 1300 proceeds to operation 1310 of removing the gate oxide layer. The method 1300 proceeds to operation 1312 of forming a second dielectric layer, which may be a liner layer to protect the gate oxide layer 214 during one or more subtractive (e.g., etching) process. The method 1300 proceeds to operation 1314 of selectively removing the second dielectric material 210. The method 100 proceeds to operation 1316 selectively growing the gate oxide layer 214 (e.g., to leave a spacer of the gate oxide layer 214 over the first metal electrode). The method 1300 proceeds to operation 1318 of selectively removing the second dielectric material 210. The method 1300 proceeds to operation 1320 of forming a number of metal structures (e.g., generally vertical metal structures) in the openings. The method 1300 proceeds to operation 1322 of forming a number of second metal electrodes and a number of third metal electrodes above the vertical metal structures. In various embodiments, the second metal electrode may be formed in the ring-based shapes (e.g., concentric disk based shapes). In various embodiments, the second metal electrode may surround or otherwise enclose the third metal electrode.

Various operations depicted in FIG. 13 may be similar to other operations depicted in this disclosure. For example, in various embodiments, the operations 1302, 1304, 1306, 1308, 1310, and 1312 may be performed in a fashion as has previously been discussed with regards to operations 102, 104, 106, 108, 110, and 112 as depicted in FIG. 1.

Figures 14A, 14B:
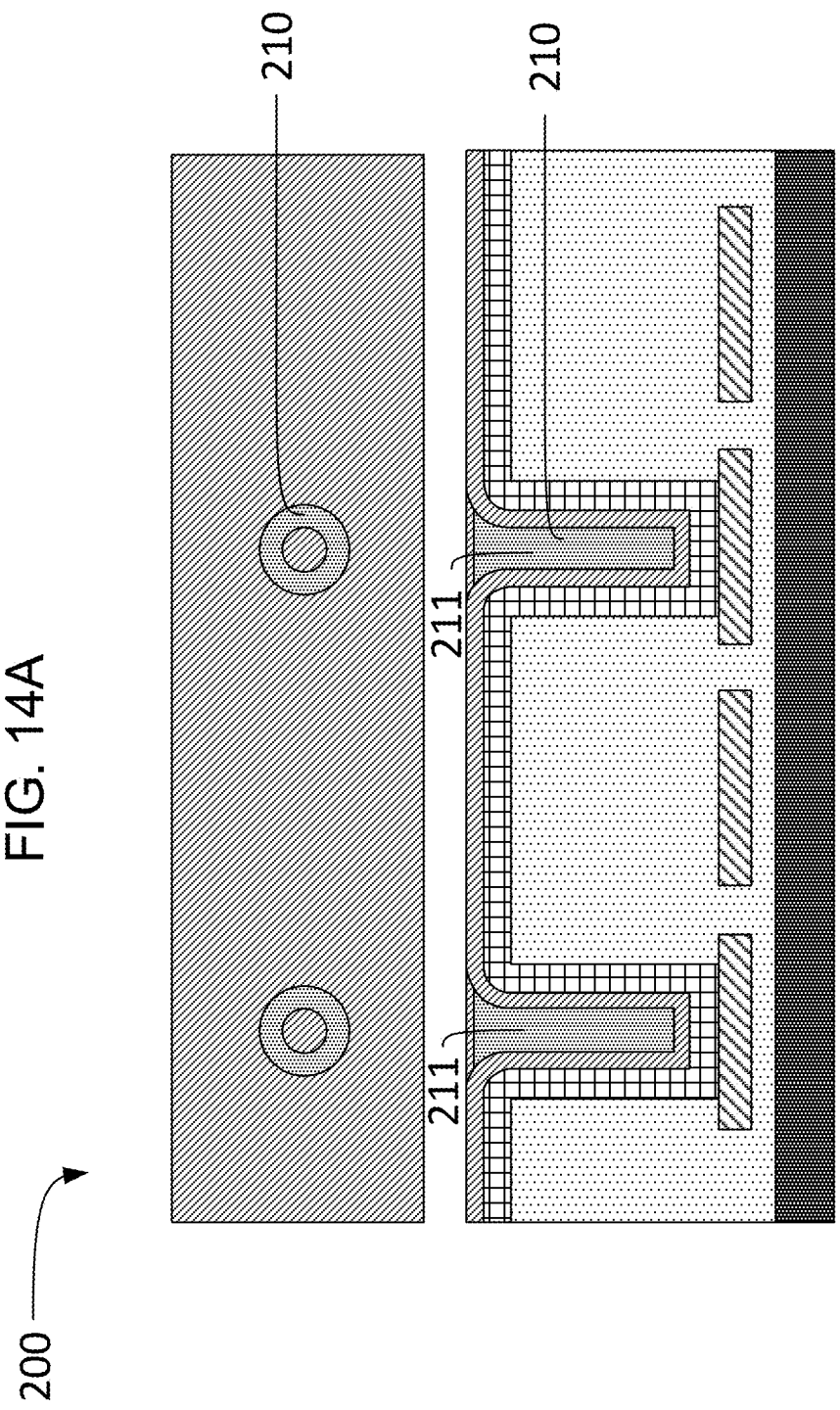
FIGS. 14A and 14B illustrate a top view and a cross-sectional view of a semiconductor device, respectively, during various fabrication stages, made by the method of FIG. 13, in accordance with some embodiments.

Corresponding to operation 1314 of FIG. 13, FIG. 14A is a top view of the semiconductor device 200 in which the second dielectric material 210 is selectively removed from the surface of the semiconductor device, and FIG. 14B is a corresponding cross-sectional view of the semiconductor device 200, in accordance with various embodiments.

A directional (e.g., vertical) etching process may be performed to remove portions of the second dielectric material 210 that are disposed parallel to the upper surface of the semiconductor device 200. For example, portions of the second dielectric material 210 may be thereby removed from an upper surface of the semiconductor device 200 and from the bottom of the first opening 211. Accordingly, a liner layer of the second dielectric material 210 may be formed around the (inner) sidewalls of the first opening 211. As further depicted, the sidewalls of the first opening 211 may transition gradually from being disposed generally vertically to being disposed generally horizontally. The directional etching process may thus remove the second dielectric material between an upper surface of the first opening 211 and a ring along the transition of the sidewalls of the first opening 211.

Corresponding to operation 1316 of FIG. 13, FIG. 15A is a top view of the semiconductor device 200 in which the gate oxide layer 214 is grown by an additive process along a surface of the semiconductor device, and FIG. 15B is a corresponding cross-sectional view of the semiconductor device 200, in accordance with various embodiments.

The gate oxide layer 214 may be grown by a deposition process (e.g., by an ALD process), which may cause the accumulation of the gate oxide material over existing gate oxide layer 214, but the second dielectric material 210, where present (e.g., along the vertical portions of the sidewalls of the first opening 211), may retard or arrest such growth. As depicted, the presence of the second dielectric material 210 along the transition of the sidewalls from their generally vertical portion to their generally horizontal portion may avoid the direct growth of the gate oxide material in a non-inward direction to avoid closure the first opening 211.

Contrasting with the sides of the first opening 211, the second dielectric material 210 may be absent along the (generally horizontal) base of the first opening 211, and thus the additive process of the gate electrode may cause the dimension of the portion of the gate oxide layer 214 to increase in z-height. Advantageously, such an increase in z-height may decrease a capacitance between the gate and the drain/source of a transistor formed according to method 1300. A deposition (e.g., ALD) thickness may be based on a desired capacitance. In some embodiments, the gate oxide material may have a relatively high dielectric constant which, advantageously, may enable control of the channel. Such embodiments, however, may require a relatively large z-height separating the drain/source from the gate to obtain a similar capacitance as a relatively low-k material (e.g., a material used in some embodiments of operation 114 of FIG. 1). Alternatively or in addition, a seed layer of the high-k material may be directionally added to the upper surface of the semiconductor and grown (to grow the gate electrode at the bottom of the first opening), and a blanket layer may thereafter cover the semiconductor device 200. Excess material may thereafter be removed from the upper surface of the semiconductor device 200 through a planarization process.

Corresponding to operation 1318 of FIG. 13, FIG. 16A is a top view of the semiconductor device 200 in which the additional second dielectric material 210 is removed from the surface of the semiconductor device, and FIG. 16B is a corresponding cross-sectional view of the semiconductor device 200, in accordance with various embodiments.

The removal of the second dielectric material may be may be performed in a fashion as has previously been discussed with regards to operation 118 as depicted in FIG. 1. Similar to operation 118, a first portion of the second dielectric material 210 may remain (e.g., based on a thickness, and the protection of the side walls of the gate oxide material, etc.). Alternatively or in addition, a second portion of the second dielectric material 210 may remain, which may be protected by an enveloping gate oxide layer 214. In some embodiments, the second portion of the second dielectric material 210 may be mechanically removed (e.g., by a CMP or CMG process). In some embodiments, such a mechanical process may be conducted prior to operation 1318. For example, in an embodiment in which the growth of the gate oxide layer 214 substantially interferes with an addition or removal of an etchant, seed layer, etc., the planarization of the upper surface of the transistor in advance of the removal of the liner may more completely remove the liner or lead to reduced damage to the gate oxide layer 214. Such embodiments may result in lower gate-channel capacitance, lower incidents of gate-channel short circuits, etc.

Figure 17A:
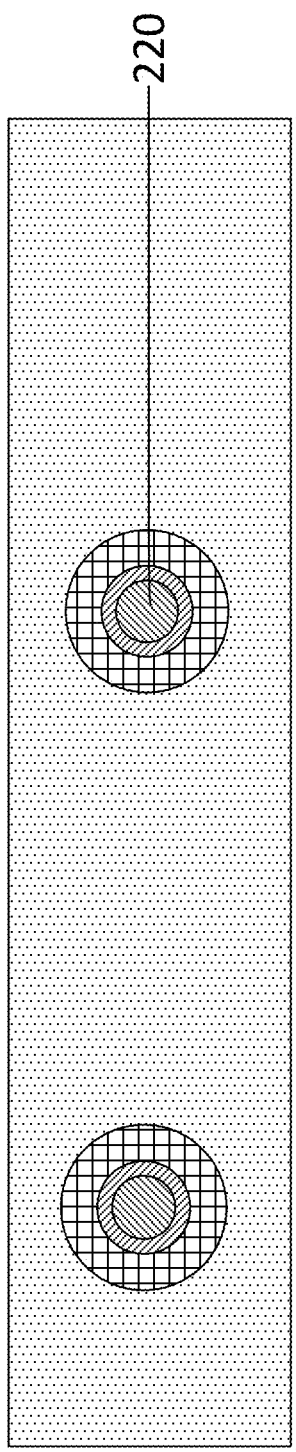
FIGS. 17A and 17B illustrate a top view and a cross-sectional view of a semiconductor device, respectively, during various fabrication stages, made by the method of FIG. 13, in accordance with some embodiments.
Figure 17B:
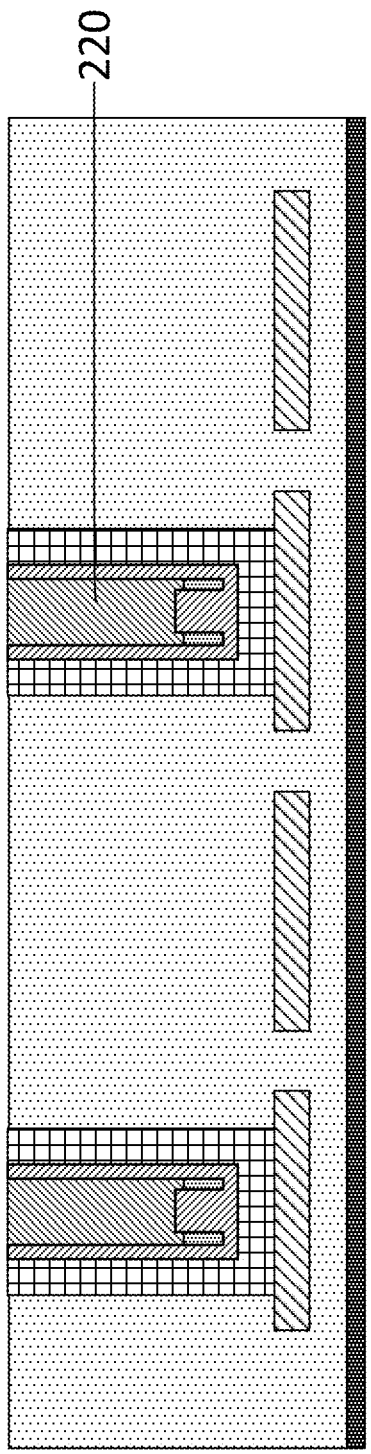

Corresponding to operation 1320 of FIG. 13, FIG. 17A is a top view of the semiconductor device 200 which has been filled with a metal material to form a first metal structure 220, which may be similar to other operations depicted in this disclosure. For example, in various embodiments, operation 1320 may be performed in a fashion as has previously been discussed with regard to operation 120. FIG. 17B is a corresponding cross-sectional view of the semiconductor device 200, in accordance with various embodiments. Although not depicted in the interest of brevity, additional electrodes may be coupled to the device in a fashion as has previously been discussed with regard to operation 122.

Figure 18:
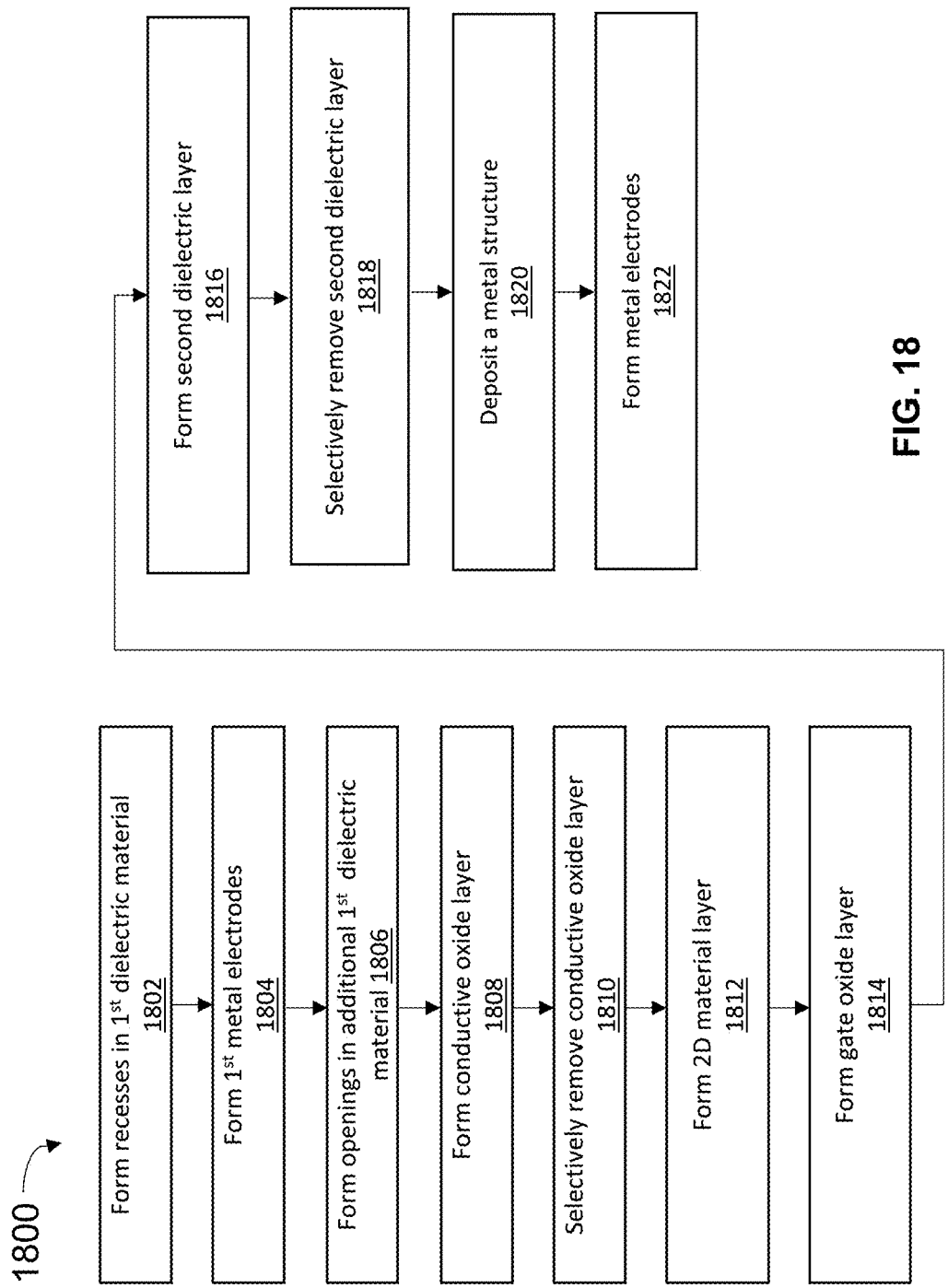
FIG. 18 is yet another flow chart of an example method for making a semiconductor device, in accordance with some embodiments.

FIG. 18 is yet another flowchart of an example method 1800 for forming a semiconductor device (e.g., a transistor) having a vertical metal structure. For example, the transistor may be a vertical transistor with a channel layer wrapping around or otherwise surrounding at least a portion of the generally vertical metal structure that also operatively functions as a gate of the transistor. It is noted that the method 1800 is merely an example, and is not intended to limit the present disclosure. Accordingly, it is understood that additional operations may be provided before, during, and after the method 1800 of FIG. 18, and that some other operations may only be briefly described herein.

In various embodiments, operations of the method 1800 may be associated with top views and cross-sectional views of an example semiconductor device 200 at various fabrication stages as shown in FIGS. 19A to 25B, respectively, which will be discussed in further detail below. It should be understood that the semiconductor device 200, shown in FIGS. 19A to 25B, may include a number of other devices such as inductors, fuses, capacitors, coils, etc., while remaining within the scope of the present disclosure.

In brief overview, the method 1800 starts with operation 1802 of forming a number of recesses in a first dielectric material. The method 1800 continues to operation 1804 of forming a number of first metal electrodes in the recesses, respectively. In various embodiments, the first metal electrodes may each be formed in a disk-based shape. The method 1800 proceeds to operation 1806 of forming a number of first openings in an additional first dielectric material. The method 1800 proceeds to operation 1808 of forming a conductive oxide layer. In some embodiments, the conductive oxide layer 216 may be surrounded by the first metal electrode (when viewed from the top). The method 1800 proceeds to operation 1810 of selectively removing the conductive oxide layer 216. The method 1800 proceeds to operation 1812 of forming 2D material 255. The method 1800 proceeds to operation 1814 of forming a gate oxide layer 214. The method 1800 proceeds to operation 1816 forming the second dielectric material 210. The method 1800 proceeds to operation 1818 of selectively removing the second dielectric material 210 and a selective addition and removal of a third dielectric material 218. The method 1800 proceeds to operation 1820 of forming a number of metal structures (e.g., generally vertical metal structures) in the first openings 211. The method 1800 proceeds to operation 1822 of forming a number of second metal electrodes and a number of third metal electrodes above the vertical metal structures. In various embodiments, the second metal electrode may be formed in the ring-based shapes (e.g., concentric disk based shapes). In various embodiments, the second metal electrode may surround or otherwise enclose the third metal electrode.

Various operations depicted in FIG. 18 may be similar to other operations depicted in this disclosure. For example, in various embodiments, the operations 1802, 1804, 1806, and 1808 may be performed in a fashion as has previously been discussed with regards to operations 102, 104, 106, and 108 as depicted in FIG. 1.

Corresponding to operation 1810 of FIG. 18, FIG. 19A is a top view of the semiconductor device 200 in which the conductive oxide material is selectively etched along a surface of the semiconductor device, and FIG. 19B is a corresponding cross-sectional view of the semiconductor device 200, in accordance with various embodiments.

Following the forming of the conductive oxide layer 216, a portion of the conductive oxide layer 216 is removed to expose at least the first metal electrode 208. As such, the conductive oxide layer 216 (after being patterned, etched, etc.) may surround the sidewalls of the first opening 211, and at least a portion of the first metal electrode may be visible as viewed from an upper surface of the semiconductor device 200. In some embodiments, an interface layer, seed layer, etc. may be deposited (e.g., selectively over the first metal electrode 208, or the upper surface of the semiconductor device 200, etc.)

Figures 20A, 20B:
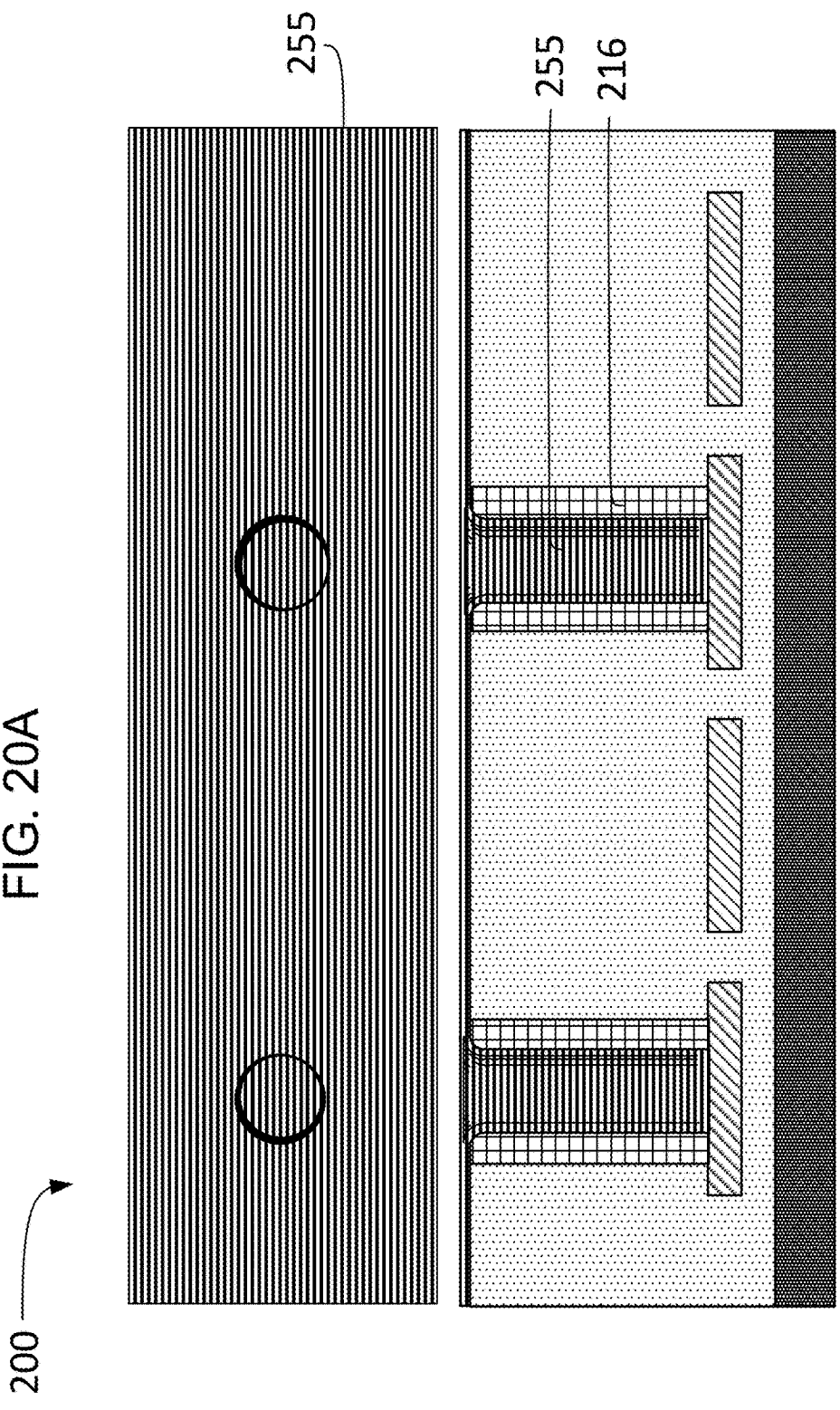
FIGS. 20A and 20B illustrate a top view and a cross-sectional view of a semiconductor device, respectively, during various fabrication stages, made by the method of FIG. 18, in accordance with some embodiments.

Corresponding to operation 1812 of FIG. 18, FIG. 20A is a top view of the semiconductor device 200 in which a 2D material is deposited along a surface of the semiconductor device, and FIG. 20B is a corresponding cross-sectional view of the semiconductor device 200, in accordance with various embodiments.

The 2D material 255 is deposited by a deposition process such as ALD. The 2D material 255 may comprise one or several atomic layers (i.e., is generally of lesser thickness than the conductive oxide layer 216) and may adhere to one of the first metal electrode 208 or an interstitial/interface layer applied thereto. The 2D material 255, together with the conductive oxide layer 216, may collectively form a channel. In various embodiments, the 2D material 255 may be electrically connected to the conductive oxide layer 216 which may, advantageously, allow greater current to flow between the parallel channels (e.g., in the event either material fails to connect to or becomes disconnected from an electrode). In some embodiments, the 2D material may be electrically and/or physically isolated from to the conductive oxide. Advantageously, some such embodiments may allow for higher electron mobility (e.g., due to the lack of interactions with a crystalline structure of the conductive oxide as transiting along the surface of the 2D material 255).

In some embodiments, the thickness of the 2D material 255 will be less than that of the conductive oxide. Consequently, the z-height of the 2D material can be less than the z-height of the conductive oxide layer 216 (e.g., in the embodiment of method 100). Such a reduced z-height may allow an additional portion of the channel to be controlled (e.g., depleted) by the gate. Alternatively, or in addition, as will be discussed with regards to FIG. 23A, another spacer may be grown, inserted, placed, etc. between a bottom surface of the first opening and the first metal electrode 208.

In some embodiments, the 2D material 255 may replace, rather than supplement the conductive oxide layer 216 as the channel. FIG. 21A depicts one such embodiment. In some embodiments, the conductive oxide layer 216 may be present as a pad to aid in the interface between the various electrodes and the 2D material 255. In some embodiments, no conductive oxide layer 216 is present. In some such embodiments, electrodes may be placed or formed to connect precisely with the 2D material 255. For example, the electrodes may be selectively formed over the 2D material 255, or a seed layer placed thereupon. Alternatively, or in addition, in some embodiments, the 2D material 255 may be connected to the second and third electrodes along a generally vertical surface, such that the "2D" material 255 is connected to the electrode along a plane of a face thereof.

FIG. 21B is a corresponding cross-sectional view of the semiconductor device 200, in accordance with various embodiments.

Figures 22A, 22B:
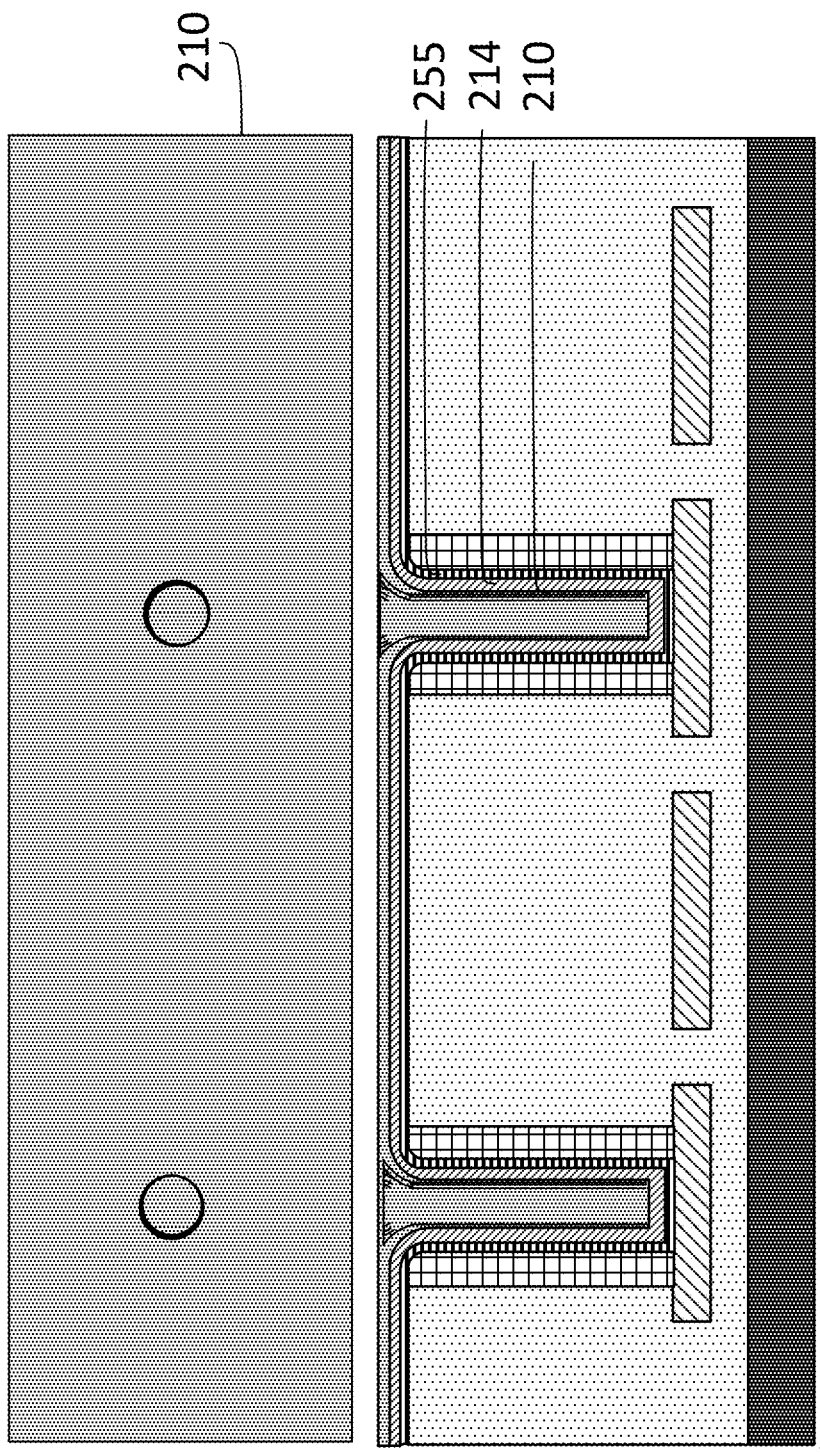
FIGS. 22A and 22B illustrate a top view and a cross-sectional view of a semiconductor device, respectively, during various fabrication stages, made by the method of FIG. 18, in accordance with some embodiments.

Corresponding to operations 1814 and 1816 of FIG. 18, FIG. 22A is a top view of the semiconductor device 200 in which a gate oxide layer 214 and a second dielectric material 210 is formed over the surface of the semiconductor device, and FIG. 22B is a corresponding cross-sectional view of the semiconductor device 200, in accordance with various embodiments.

Operations 1814 and 1816 may be similar to other operations depicted in this disclosure. For example, in various embodiments, the operations may be similar to operations 110 and 112 of FIG. 1. Just as the operations of FIG. 1 may comprise various additional operations, the interfacing of the oxide layer to the 2D material 255 may involve additional bonding, adhesion, seeding, or other layers or operations. In some embodiments, the conductive oxide layer 216 may be configured to adhere directly to the 2D material 255.

Corresponding to operation 1818 of FIG. 18, the second dielectric material 210 may be selectively removed from the surface of the semiconductor device, which may further comprise the additional and selective removal of a third dielectric material 218. Operation 1818 may be similar to other operations depicted in this disclosure. For example, in various embodiments, operation 1818 may be performed in a similar fashion operations 114, 116, and 118 of FIG. 1. Alternatively or in addition, spacers may be formed by other methods, which have already been discussed herein. For example, FIG. 23A depicts an alternate spacer which can be formed similarly to the gate oxide material 214 of FIG. 16A (operation 1318). FIG. 23B is a corresponding cross-sectional view of the semiconductor device 200, in accordance with various embodiments.

Corresponding to operation 1820 of FIG. 18, FIG. 24A is a top view of the semiconductor device 200 in which a first metal structure 220 is formed within a remaining portion of the first opening 211 of the semiconductor device 200. The first metal structure 220 may be placed in various embodiments, such as those comprising a conductive oxide layer 216, a 2D material 255 (as depicted) or both. FIG. 24B is a corresponding cross-sectional view of the semiconductor device 200, in accordance with various embodiments. Operation 1820 may be similar to other operations depicted in this disclosure. For example, in various embodiments, the operations may be similar to operation 120 of FIG. 1.

Corresponding to operation 1822 of FIG. 18, FIG. 25A is a top view of the semiconductor device 200 in which the second metal electrode 238 and third metal electrode 248 are formed over the surface of the semiconductor device 200. The first metal structure 220 may be placed in various embodiments, such as those comprising a conductive oxide layer 216, a 2D material 255 (as depicted) or both. FIG. 25B is a corresponding cross-sectional view of the semiconductor device 200, in accordance with various embodiments. Operation 1820 may be similar to other operations depicted in this disclosure. For example, in various embodiments, the operations may be similar to operation 122 of FIG. 1.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence has any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A semiconductor device, comprising:
  a transistor structure comprising:
    a metal structure extending along a vertical direction;
    a gate dielectric layer having a least a first portion around the metal structure;
    a channel layer having at least a first portion around the gate dielectric layer;
    a first metal electrode disposed below the metal structure and in electrical contact with a first end of the first portion of the channel layer;
    a second metal electrode disposed above the metal structure and in electrical contact with a second end of the first portion of the channel layer;
    a third metal electrode disposed above and in electrical contact with the metal structure; and
    a dielectric structure disposed between the metal structure and the first metal electrode.

2. The semiconductor device of claim 1, further comprising:
  a second transistor structure laterally disposed next to the transistor structure and comprising:
    a second metal structure extending along the vertical direction;
    a second gate dielectric layer having a least a first portion around the second metal structure;
    a second channel layer having a least a first portion around the second gate dielectric layer;
    a fourth metal electrode disposed below the second metal structure and above the first metal structure, and in electrical contact with a first end of the first portion of the second channel layer;
    a fifth metal electrode disposed above the second metal structure and in electrical contact with a second end of the first portion of the second channel layer;
    a sixth metal structure disposed above and in electrical contact with the second metal structure; and
    a second dielectric structure disposed between the second metal structure and the fourth metal electrode.

3. The semiconductor device of claim 2, wherein the channel layer and second channel layer have respectively different conductive types.

4. The semiconductor device of claim 1, wherein the first metal electrode is formed in a solid disk shape, and the second metal electrode is formed in a ring shape.

5. The semiconductor device of claim 4, wherein the second metal electrode extends around the third metal electrode.

6. The semiconductor device of claim 1, wherein the gate dielectric layer and the channel layer each further have a second portion disposed below the metal structure, and wherein the respective second portions of the gate dielectric layer and channel layer are further disposed below the dielectric structure.

7. The semiconductor device of claim 1, further comprising a dielectric liner at least laterally separating the dielectric structure from the gate dielectric layer.

8. The semiconductor device of claim 1, wherein the dielectric structure is a second portion of the gate dielectric layer that is surrounded by the first portion of the gate dielectric layer.

9. The semiconductor device of claim 1, wherein the channel layer further comprises:
  a two-dimensional material around the gate dielectric layer; and
  a conductive oxide material around the two-dimensional material.

10. The semiconductor device of claim 9, wherein the two-dimensional material has a vertical portion and a horizontal portion, both of which are in physical contact with the conductive oxide material.

11. The semiconductor device of claim 1, wherein the channel layer essentially consists of a two-dimensional material around the gate dielectric layer.

12. A semiconductor device, comprising:
  a first transistor structure comprising:
    a first metal structure extending along a vertical direction;
    a first gate dielectric layer around the first metal structure;
    a first channel layer around the first gate dielectric layer;
    a first metal electrode disposed below and in electrical contact with the first channel layer;
    a second metal electrode disposed above the first metal structure and in electrical contact with the first channel layer;
    a third metal electrode surrounded by the second metal structure and in electrical contact with the first metal structure; and
    a first dielectric structure configured to lift the first metal structure away from the first metal electrode; and
  a second transistor structure laterally disposed next to the first transistor structure and comprising:
    a second metal structure extending along the vertical direction;
    a second gate dielectric layer around the second metal structure;
    a second channel layer around the second gate dielectric layer;
    a fourth metal electrode disposed below and in electrical contact with the second channel layer;
    a fifth metal electrode disposed above the second metal structure and in electrical contact with the second channel layer;
    a sixth metal electrode surrounded by the fifth metal structure and in electrical contact with the second metal structure; and
    a second dielectric structure configured to lift the second metal structure away from the fourth metal electrode.

13. The semiconductor device of claim 12, wherein the first channel layer and second channel layer have respectively different conductive types.

14. The semiconductor device of claim 12, wherein the first transistor structure further comprises a first dielectric liner at least laterally separating the first dielectric structure from the first gate dielectric layer, and the second transistor structure further comprises a second dielectric liner at least laterally separating the second dielectric structure from the second gate dielectric layer.

15. The semiconductor device of claim 12, wherein
the first channel layer further comprises:
- a first two-dimensional material around the first gate dielectric layer; and
- a first conductive oxide material around the first two-dimensional material; and the second channel layer further comprises:
- a second two-dimensional material around the second gate dielectric layer; and
- a second conductive oxide material around the second two-dimensional material.

16. The semiconductor device of claim 12, wherein
the first channel layer essentially consists of a first two-dimensional material; and
the second channel layer essentially consists of a second two-dimensional material.

17. A method for fabricating semiconductor devices, comprising:
- forming a first metal electrode at a bottom of an opening of a dielectric layer;
- lining the opening with a channel layer, wherein the channel layer is in electrical contact with the first metal electrode;
- further lining the opening with a gate dielectric layer;
- forming a dielectric structure above a horizontal portion of the gate dielectric layer;
- forming a gate structure by filling a remaining portion of the opening with a metal material;
- forming a second metal electrode above the gate structure, wherein the second metal electrode is in electrical contact with the channel layer; and
- forming a third metal electrode surrounded by the second metal electrode, wherein the third metal electrode is in electrical contact with the gate structure.

18. The method of claim 17, wherein the step of lining the opening with a channel layer comprises:
- depositing a conductive oxide material over the opening;
- etching horizontal portions of the conductive oxide material; and
- lining the opening with a two-dimensional material.

19. The method of claim 17, wherein the step of further lining the opening with a gate dielectric layer comprises:
- depositing a first high-k dielectric material over the opening;
- depositing a dielectric material over the first high-k dielectric material to form a dielectric liner; and
- etching horizontal portions of the dielectric liner.

20. The method of claim 19, wherein the step of forming a dielectric structure comprises:
- selectively depositing a second high-k dielectric material over the first high-k dielectric material; and
- etching vertical portions of the dielectric liner.

* * * * *